United States Patent
Fujii et al.

(10) Patent No.: US 10,988,410 B2
(45) Date of Patent: Apr. 27, 2021

(54) GLASS SUBSTRATE WITH ANTIFOULING LAYER AND FRONT PLATE FOR DISPLAY

(71) Applicant: AGC Inc., Chiyoda-ku (JP)

(72) Inventors: Kensuke Fujii, Chiyoda-ku (JP);
Michinori Suehara, Chiyoda-ku (JP);
Daisuke Kobayashi, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/398,148

(22) Filed: Jan. 4, 2017

(65) Prior Publication Data
US 2017/0197875 A1 Jul. 13, 2017

(30) Foreign Application Priority Data

Jan. 12, 2016 (JP) .............................. JP2016-003387

(51) Int. Cl.
| | | |
|---|---|---|
| *C03C 17/42* | (2006.01) | |
| *C23C 14/10* | (2006.01) | |
| *G02B 27/00* | (2006.01) | |
| *G02B 1/115* | (2015.01) | |
| *C23C 14/34* | (2006.01) | |

(52) U.S. Cl.
CPC .............. *C03C 17/42* (2013.01); *C23C 14/10* (2013.01); *C23C 14/34* (2013.01); *G02B 27/0006* (2013.01); *C03C 2217/734* (2013.01); *C03C 2217/76* (2013.01); *C03C 2217/77* (2013.01);
(Continued)

(58) Field of Classification Search
CPC .......... G02B 1/11; G02B 1/105; G02B 1/115; G02B 27/0006; C03C 17/3441; C03C 2217/734; C03C 2217/78; C03C 27/048; Y10T 428/24942
See application file for complete search history.

(56) References Cited

U.S. PATENT DOCUMENTS

| | | | | |
|---|---|---|---|---|
| 5,246,782 A | * | 9/1993 | Kennedy | .................... C08J 5/04 |
| | | | | 428/421 |
| 5,506,443 A | * | 4/1996 | Furumura | ........... H01L 21/3105 |
| | | | | 257/635 |

(Continued)

FOREIGN PATENT DOCUMENTS

| | | |
|---|---|---|
| DE | 11 2014 000 613 | 10/2015 |
| EP | 2 270 554 | 1/2011 |

(Continued)

OTHER PUBLICATIONS http://abrisatechnologies.com/products-services/glass-products/high-ion-exchange-hie/asahi-dragontrail/; 2017 Website.*
Extended European Search Report dated Sep. 8, 2020.

*Primary Examiner* — Humera N. Sheikh
*Assistant Examiner* — Elizabeth D Ivey
(74) *Attorney, Agent, or Firm* — Oblon, McClelland, Maier & Neustadt, L.L.P.

(57) ABSTRACT

A glass substrate with an antifouling layer includes: a glass substrate which has a pair of principal surfaces facing to each other; a cohesive layer provided on the side of one principal surface of the glass substrate; and an antifouling layer provided on a surface of the cohesive layer, wherein the cohesive layer has a layer, the layer is in contact with the antifouling layer, contains mainly a silicon oxide, and contains carbon atoms at a concentration of $5 \times 10^{18}$ atoms/cm$^3$ to $5 \times 10^{19}$ atoms/cm$^3$.

13 Claims, 3 Drawing Sheets

(52) U.S. Cl.
CPC .... *C03C 2218/155* (2013.01); *C03C 2218/31* (2013.01); *G02B 1/115* (2013.01)

(56) References Cited

U.S. PATENT DOCUMENTS

| | | | |
|---|---|---|---|
| 6,338,870 B1* | 1/2002 | Jaccoud | B05D 1/62 |
| | | | 427/171 |
| 2007/0053063 A1* | 3/2007 | Adachi | G02B 1/111 |
| | | | 359/582 |
| 2011/0033679 A1 | 2/2011 | Fukawa et al. | |
| 2011/0048611 A1* | 3/2011 | Carre | H01L 21/6835 |
| | | | 156/73.1 |
| 2011/0062849 A1* | 3/2011 | Carlson | C03C 3/093 |
| | | | 313/110 |
| 2013/0022798 A1 | 1/2013 | Fukawa et al. | |
| 2015/0338552 A1* | 11/2015 | Fujii | G02B 1/105 |
| | | | 359/601 |
| 2016/0351093 A1* | 12/2016 | Kim | G09G 3/2092 |

FOREIGN PATENT DOCUMENTS

| | | | | |
|---|---|---|---|---|
| JP | 2005-266291 A | 9/2005 | | |
| JP | 2012-076291 A | 4/2012 | | |
| JP | WO 2014129333 A1 * | 8/2014 | ............ | G02B 1/105 |
| WO | WO 2008/114627 A1 | 9/2008 | | |
| WO | WO 2009/131206 A1 | 10/2009 | | |
| WO | WO 2014/119453 A1 | 8/2014 | | |
| WO | WO 2014/129333 A1 | 8/2014 | | |

* cited by examiner

GLASS SUBSTRATE WITH ANTIFOULING LAYER AND FRONT PLATE FOR DISPLAY

CROSS REFERENCE TO RELATED APPLICATION

This application is based upon and claims the benefit of priority from Japanese Patent Application No. 2016-003387 filed on Jan. 12, 2016; the entire contents of which are incorporated herein by reference.

FIELD

Embodiments described herein relate generally to a glass substrate with an antifouling layer and a front plate for a display.

BACKGROUND

Conventionally, a cover glass has been used as a front plate of a touch panel and a display panel used for a display device or the like of a smartphone, a tablet PC, and a car navigator. Human fingers or the like are in touch with these touch panel and display panel when they are used, and therefore, fouling due to fingerprints, sebum, sweat, and so on are easy to adhere thereto. Once the fouling adheres, the fouling is difficult to be removed, and is stood out due to scattering of light and difference in reflection between a part where the fouling adheres and a part where the fouling does not adhere. Accordingly, there has been a problem that the fouling spoils visibility and beauty. There is therefore known a method using a glass substrate, as a cover glass, where an antifouling layer made of a fluorine-containing organosilicon compound is formed at a part where the human fingers or the like are in touch.

High water repellency or high oil repellency are required for the antifouling layer to suppress the adhesion of the fouling, and abrasion resistance is required for repeated wiping to remove the adhered fouling, and therefore, a method to increase durability of the antifouling layer has been conventionally studied.

As the glass substrate with the antifouling layer where the durability of the antifouling layer is increased, there have been proposed a glass substrate with an antifouling layer where the antifouling layer is formed on a surface of the glass substrate having a concave-convex shape (for example, refer to Patent Document 1), and a glass substrate with an antifouling layer including a low-reflection film between the glass substrate and the antifouling layer (for example, refer to Patent Document 2). As stated above, improvement in the abrasion resistance of the antifouling layer has been required for the glass substrate with the antifouling layer.

PRIOR ART DOCUMENT

Patent Document

Patent Reference 1: International Publication No. WO 2014/119453 A1
Patent Reference 2: International Publication No. WO 2014/129333 A1

SUMMARY

The present invention is made to solve the above-stated problems, and an object of the present invention is to provide a glass substrate with an antifouling layer excellent in abrasion resistance of the antifouling layer.

A glass substrate with an antifouling layer of the present invention includes: a glass substrate which has a pair of principal surfaces facing to each other; a cohesive layer provided on the side of one principal surface of the glass substrate; and an antifouling layer provided on a surface of the cohesive layer, wherein the cohesive layer has a layer, the layer is in contact with the antifouling layer, contains mainly a silicon oxide, and contains carbon atoms at a concentration of $5\times10^{18}$ atoms/cm$^3$ to $5\times10^{19}$ atoms/cm$^3$.

In the glass substrate with the antifouling layer of the present invention, the layer which is in contact with the antifouling layer has an arithmetic mean roughness (Ra) of preferably 3 nm or less.

In the glass substrate with the antifouling layer of the present invention, the cohesive layer is constituted by preferably one or more layers to eight layers or less.

In the glass substrate with the antifouling layer of the present invention, the cohesive layer is preferably a laminate of a layer made of one or more kinds of compounds selected from a silicon nitride, a niobium oxide, a tantalum oxide, and a zirconium oxide, and a layer made of the silicon oxide alternately.

In the glass substrate with the antifouling layer of the present invention, the antifouling layer is preferably made of a cured product of a film-forming composition containing a fluorine-containing hydrolyzable silicon compound.

In the glass substrate with the antifouling layer of the present invention, the one principle surface preferably has a concave-convex shape.

In the glass substrate with the antifouling layer of the present invention, the concave-convex shape has a root mean square roughness (RMS) of preferably 10 nm or more. Besides, the concave-convex shape has the root mean square roughness (RMS) of preferably 1000 nm or less.

In the glass substrate with the antifouling layer of the present invention, the cohesive layer and the antifouling layer preferably extend in a region from the side of the one principal surface to an end face connecting the pair of principal surfaces.

In the glass substrate with the antifouling layer of the present invention, the cohesive layer preferably extends in a region from the side of the one principal surface to an end face connecting the pair of principal surfaces, and the antifouling layer extends from a surface of the cohesive layer to a surface of the end face.

A front plate for a display of the present invention includes the above-stated glass substrate with the antifouling layer.

According to the present invention, it is possible to provide a glass substrate with an antifouling layer excellent in abrasion resistance of the antifouling layer.

DETAILED DESCRIPTION

Hereinafter, embodiments of the present invention are described in detail with reference to the drawings.

[Glass Substrate with Antifouling Layer]

Figure 1:
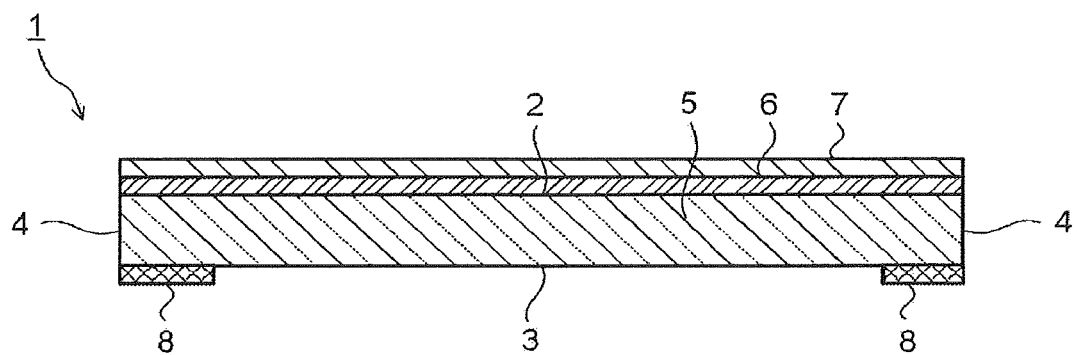
FIG. 1 is a sectional view schematically illustrating a glass substrate with an antifouling layer of an embodiment.

FIG. 1 is a sectional view schematically illustrating a glass substrate with an antifouling layer of an embodiment. A glass substrate with an antifouling layer 1 illustrated in FIG. 1 includes a glass substrate 5 having a first principal surface 2 and a second principal surface 3 facing to each other, and an end face 4 connecting the first principal surface 2 and the second principal surface 3.

The glass substrate with the antifouling layer 1 includes a cohesive layer 6 provided on the side of the first principal surface 2 of the glass substrate 5, and an antifouling layer 7 provided on a surface of the cohesive layer 6. Besides, the glass substrate with the antifouling layer 1 includes a printed layer 8 provided at a peripheral edge part of the second principal surface 3. The printed layer 8 is not essential, but included according to need.

The cohesive layer 6 has a layer (hereinafter, called also as a "contact layer") which is in contact with the antifouling layer 7. The contact layer is a carbon-containing silicon oxide layer which contains mainly a silicon oxide, and contains carbon atoms at a concentration of $5 \times 10^{18}$ atoms/$cm^3$ to $5 \times 10^{19}$ atoms/$cm^3$.

For the glass substrate with the antifouling layer 1, the concentration of carbon atoms contained in the carbon-containing silicon oxide layer that is the contact layer of the cohesive layer 6 is in the above-stated range, and thereby, it is possible to firmly adhere the antifouling layer 7 to the glass substrate 5 through the cohesive layer 6 to supply excellent abrasion resistance to the antifouling layer 7.

The antifouling layer 7 is formed by, for example, a hydrolysis and condensation reaction performed as described below by a fluorine-containing hydrolyzable silicon compound such as a later-described fluorine-containing organosilicon compound on a surface of the cohesive layer 6 formed on the first principal surface 2 of the glass substrate. The antifouling layer 7 functions as the antifouling layer because the antifouling layer 7 has water repellency or oil repellency. In this description, the fluorine-containing hydrolyzable silicon compound is a compound which has a hydrolyzable silyl group where a hydrolyzable group or atom is bonded to a silicon atom, and which has a fluorine-containing organic group bonded to the silicon atom. Note that the hydrolyzable group or atom which is bonded to the silicon atom and constitutes the hydrolyzable silyl group is called as a "hydrolyzable group".

Namely, the hydrolyzable silyl group of the fluorine-containing hydrolyzable silicon compound becomes a silanol group by the hydrolysis, and then dehydration condensation occurs between molecules to generate a siloxane bond represented by —Si—O—Si—, and thereby, a fluorine-containing organosilicon compound film is formed. In the fluorine-containing organosilicon compound film, almost all of the fluorine-containing organic groups bonded to the silicon atom of the siloxane bond exist in a vicinity of a surface of the film at the cohesive layer 6 side, and the water repellency or the oil repellency can be exhibited by an action of the fluorine-containing organic group. In this case, the silanol group chemically bonds to a hydroxyl group at a surface of the cohesive layer 6 at the antifouling layer 7 side that is a film-formation surface where the antifouling layer 7 is formed, namely, at a surface of the silicon oxide layer by a dehydration condensation reaction, to form an adhered point through the siloxane bond. As stated above, for the glass substrate with the antifouling layer 1, the glass substrate with the antifouling layer 1 has excellent antifouling property because the antifouling layer 7 is firmly adhered to the glass substrate 5 through the cohesive layer 6.

Note that the fluorine-containing hydrolyzable silicon compound may be a fluorine-containing silicon compound having a silanol group and a fluorine-containing organic group to be bonded to a silicon atom, and the same effect as stated above can be obtained also in this case.

Next, each component of the glass substrate with the antifouling layer 1 according to the embodiment of the present invention is described in detail.

(Glass Substrate 5)

The glass substrate 5 used for the glass substrate with the antifouling layer 1 of the embodiment is not particularly limited as long as the glass substrate 5 is a glass substrate required to be supplied generally the antifouling property of the antifouling layer. A glass substrate of a general glass whose main component is a silicon dioxide such as a soda-lime silicate glass, an aluminosilicate glass, a borosilicate glass, an alkali-free glass, a quartz glass can be used for the glass substrate 5.

The glass substrate 5 is preferably strengthened by physical strengthening treatment or chemical strengthening treatment, and the chemical strengthening treatment is more preferable.

A composition of the glass of the glass substrate 5 is preferably a composition where molding and the strengthening by the chemical strengthening treatment can be performed, and preferably contains an alkali metal whose ionic radius is small such as sodium and lithium. As the glass as stated above, there are preferably used, specifically, for example, the aluminosilicate glass, the soda-lime silicate glass, the borosilicate glass, a lead glass, an alkali barium glass, an aluminoborosilicate glass, and so on.

As the glass composition of the glass substrate 5 used in the embodiment, it is not particularly limited, and glasses having various compositions can be used. As the glass composition, for example, there can be cited the following glass compositions (they are all the aluminosilicate glasses).

(i) As a composition represented by mol %, a glass containing $SiO_2$ of 50% to 80%, $Al_2O_3$ of 2% to 25%, $Li_2O$ of 0% to 10%, $Na_2O$ of 0% to 18%, $K_2O$ of 0% to 10%, MgO of 0% to 15%, CaO of 0% to 5%, and $ZrO_2$ of 0% to 5%

(ii) As a composition represented by mol %, a glass containing $SiO_2$ of 50% to 74%, $Al_2O_3$ of 1% to 10%, $Na_2O$ of 6% to 14%, $K_2O$ of 3% to 11%, MgO of 2% to 15%, CaO of 0% to 6%, and $ZrO_2$ of 0% to 5%, a sum total of contents of $SiO_2$ and $Al_2O_3$ of 75% or less, a sum total of contents of $Na_2O$ and $K_2O$ of 12% to 25%, and a sum total of contents of MgO and CaO of 7% to 15%

(iii) As a composition represented by mol %, a glass containing $SiO_2$ of 68% to 80%, $Al_2O_3$ of 4% to 10%, $Na_2O$ of 5% to 15%, $K_2O$ of 0% to 1%, MgO of 4% to 15%, and $ZrO_2$ of 0% to 1%

(iv) As a composition represented by mol %, a glass containing $SiO_2$ of 67% to 75%, $Al_2O_3$ of 0% to 4%, $Na_2O$ of 7% to 15%, $K_2O$ of 1% to 9%, MgO of 6% to 14%, and $ZrO_2$ of 0% to 1.5%, a sum total of contents of $SiO_2$ and $Al_2O_3$ of 71% to 75%, a sum total of contents of $Na_2O$ and $K_2O$ of 12% to 20%, and when CaO is contained, a content thereof of less than 1%

As the glass substrate 5 used in the embodiment, there may be used a glass containing coloring components (a metal oxide of Co, Mn, Fe, Ni, Cu, Cr, V, Bi, Se, Ti, Ce, Er, and Nd) as long as visibility is not inhibited.

A manufacturing method of the glass substrate 5 is not particularly limited, and the glass substrate 5 can be manufactured by charging desired glass raw materials in a continuous melting furnace, heating and melting the glass raw materials at preferably 1500° C. to 1600° C., fining, and thereafter, supplying to a molding apparatus to mold the molten glass into a plate shape, and gradually cooling.

Note that a molding method of the glass substrate 5 is also not particularly limited, and for example, there can be used the molding methods such as a down-draw method (for example, an overflow down-draw method, a slot down method, a redraw method, and so on), a float method, a roll-out method, and a pressing method.

A shape of the glass substrate 5 may be a shape not only a flat shape as illustrated in the drawing but also a shape having a curved surface such as a glass having one or more bending parts. Recently, there are ones where a display surface of an image display device has a curved surface among various equipment (television, personal computer, smartphone, car navigation, and so on) including the image display device.

The glass substrate with the antifouling layer 1 where the glass substrate 5 has the shape with the curved surface is useful as the image display device as stated above. For example, when the glass substrate with the antifouling layer 1 is formed by using a glass having a horseshoe shape in cross section with the bending part, and is used as a front plate of a cellular phone or the like, a frequency when a user touches the glass substrate with the antifouling layer 1 increases. The antifouling layer is thereby gradually removed, and the fouling adhesion suppression effect is lowered. The glass substrate with the antifouling layer 1 of the present invention is excellent in the abrasion resistance, and it is useful for the above-stated purpose.

When the glass substrate 5 has the curved surface, a whole surface of the glass substrate 5 may be formed by the curved surface, or the surface may be formed by a curved part and a flat part. As an example when the whole surface is formed by the curved surface, for example, there can be cited a case when a cross section of a glass base material is an arc shape.

When the glass substrate 5 has the curved surface, a curvature radius (hereinafter, it is also referred to as "R") of the above-stated surface can be appropriately set in accordance with a purpose of the use of the glass substrate with the antifouling layer 1, a kind of the glass substrate 5, and it is not particularly limited, but R is preferably 25000 mm or less, more preferably 1 mm to 5000 mm, and particularly preferably 5 mm to 3000 mm. When the R is the above-stated upper limit value or less, it is excellent in design compared to a flat plate. When the R is the above-stated lower limit value or more, it is possible to uniformly form the antifouling layer 7 also on the surface of the curved surface.

A thickness of the glass substrate 5 can be appropriately set in accordance with the purpose of the use. The thickness of the glass substrate 5 is preferably 0.1 mm to 5 mm, more preferably 0.2 mm to 2 mm, and further preferably 0.5 mm to 2 mm. When the thickness of the glass substrate 5 is 5 mm or less, it is possible to effectively perform the later-described chemical strengthening treatment for the glass substrate 5, and both strength and reduction in weight can be enabled. The thickness of the glass substrate 5 is more preferably 3 mm or less from a point to effectively perform the chemical strengthening treatment. Besides, when the thickness of the glass substrate 5 is 1 mm or more, excellent strength can be obtained when the glass substrate 5 is used for a touch panel. The thickness of the glass substrate 5 is set to 2 mm or less, then excellent sensitivity can be obtained when the glass substrate 5 is used for the touch panel.

In the glass substrate with the antifouling layer 1 of the embodiment, the first principal surface 2 of the glass substrate 5 to be used preferably has a concave-convex shape to supply an antiglare property to the glass substrate with the antifouling layer 1.

The concave-convex shape is supplied by, for example, an antiglare treatment and an etching treatment. As the shape of the first principal surface 2 having the concave-convex shape, a surface roughness in a root mean square roughness (RMS) is preferably 10 nm to 1500 nm, more preferably 10 nm to 1000 nm, further preferably 10 nm to 500 nm, and particularly preferably 10 nm to 200 nm. The RMS is in the above-stated range, and thereby, it is possible to adjust a haze value of the first principal surface 2 having the concave-convex shape to be 3% to 30%, and as a result, it is possible to supply the excellent antiglare property to the obtained glass substrate with the antifouling layer 1.

Note that the root mean square roughness (RMS) can be measured based on a method defined by JIS B 0601: (2001). As a measurement method of the RMS, specifically, a visual field range of 300 μm×200 μm is set for a measurement surface of the glass substrate 5 that is a sample after the antiglare treatment, and then the height information of the glass substrate 5 is measured by a laser microscope (manufactured by KEYENCE CORPORATION brand name: VK-9700). A cut-off correction is performed for the measurement value and a mean square of the obtained heights is calculated to obtain the RMS. It is preferable to use 0.08 mm as the cut-off value. The haze value is a value measured by a definition of JIS K 7136.

Besides, when the first principal surface 2 having the concave-convex shape is observed from above, circular pores are observed. A size of each circular pore observed as stated above (a diameter in perfect circle conversion) is preferably 5 μm to 50 μm. The size is in the range as stated above, and thereby, both an antidazzle property and the antiglare property of the glass substrate with the antifouling layer 1 are enabled.

Besides, the chemical strengthening treatment is preferably performed for the glass substrate 5 to increase the strength of the glass substrate with the antifouling layer 1. The chemically strengthened glass substrate 5 has, for example, a surface compressive stress (CS) of 450 MPa to 1200 MPa, and a depth of a stress layer (DOL) of 10 μm to 50 μm.

(Cohesive Layer 6)

The cohesive layer 6 is formed on a surface of the first principal surface 2 of the glass substrate 5 as stated above. The cohesive layer 6 is made of a single layer or a laminate where a plurality of layers are laminated. The layer of the cohesive layer 6 which is in contact with the antifouling layer 7 is the carbon-containing silicon oxide layer whose main body is the silicon oxide, and which contains carbon atoms at the concentration of $5 \times 10^{18}$ atoms/cm$^3$ to $5 \times 10^{19}$ atoms/cm$^3$. The layer which is in contact with the antifouling layer 7 is the carbon-containing silicon oxide layer in the above-stated range, and thereby, the antifouling layer 7 is firmly adhered to the glass substrate 5 through the cohesive layer 6. Accordingly, the glass substrate with the antifouling layer 1 has the excellent abrasion resistance. The carbon-containing silicon oxide layer preferably contains carbon atoms at the concentration of $6 \times 10^{18}$ atoms/cm$^3$ to $4 \times 10^{19}$ atoms/cm$^3$.

The carbon-containing silicon oxide layer can be formed by using the same method as a low refractive index layer whose material is the silicon oxide (SiO$_2$) in a later-described low-reflection film. For example, as described later, the formation of the silicon oxide layer which constitutes the cohesive layer 6 is performed under a state where an adhesive made of a carbon-containing material is adhered on a surface of the printed layer 8 formed on the second principal surface 3 of the glass substrate 5 while being exposed from an outer periphery of the glass substrate 5. A carbon component contained in the carbon-containing material of the adhesive is thereby volatilized from a part exposed from the outer periphery of the glass substrate 5 due to heating or plasma damage when the silicon oxide layer is formed, and the carbon component is taken into the silicon oxide layer. The carbon-containing silicon oxide layer where carbon atoms are contained at the above-stated predetermined ratio is thereby formed. A content of carbon atoms at this time can be adjusted by changing an area of the adhesive exposed from the outer periphery of the glass substrate 5.

Besides, as stated above, the carbon component contained in the adhesive is volatilized by being exposed to the heating or plasma to be taken into the silicon oxide layer, and therefore, it is also possible to form a layer where an element other than carbon, for example, fluorine (F) or the like is taken into the silicon oxide layer by selecting a material which composes the adhesive. Besides, it is possible to form the silicon oxide layer which takes in an element by using a material containing the element to be taken into the silicon oxide layer other than the adhesive, and by forming the silicon oxide layer under a state where the material is exposed to heat or plasma.

Besides, when the cohesive layer 6 is made of the laminate, it can be constituted as a low-reflection film where later-described low refractive index layers and high refractive index layers are laminated and a layer which is in contact with the antifouling layer 7 is constituted as the low refractive index layer made of the carbon-containing silicon oxide (SiO$_2$). In this case, the low-reflection film functions as the cohesive layer 6 made of the laminate.

Note that the "main body" described here means that impurities (other than carbon atoms) may be contained in a main body component for an extent that property other than cohesiveness of the main body component with the antifouling layer 7 do not change. For example, when the cohesive layer 6 functions as the low-reflection film, a refractive index of the silicon oxide used as the layer which is in contact with the antifouling layer 7 is normally 1.43 to 1.50 when carbon atoms are not contained, but the impurities may be contained for an extent that the refractive index becomes 1.40 to 1.53, preferably 1.45 to 1.52.

A surface roughness of the layer of the cohesive layer 6 which is in contact with the antifouling layer 7 is preferably 3 nm or less, more preferably 2 nm or less, and further preferably 1.5 nm or less in an arithmetic mean roughness (Ra). When the Ra is 3 nm or less, a cloth or the like can be deformed along the concave-convex shape of the antifouling layer 7, and therefore, a load is approximately uniformly applied on a whole surface of the antifouling layer 7. It is therefore conceivable that peeling of the antifouling layer is suppressed, and the abrasion resistance is improved.

Note that the arithmetic mean roughness (Ra) is a value where absolute value deviations from a reference plane are averaged at a roughness curve contained in a reference length taken on the reference plane. As the Ra is closer to 0, it means that the surface is near to a completely smooth surface. The Ra can be measured based on a method defined by, for example, JIS B 0601: (2001). As a measurement method of the Ra, specifically, a visual field range of 3 μm×3 μm is set for a measurement surface of the glass substrate 5 that is the sample after the formation of the cohesive layer 6, and a flat profile of the glass substrate 5 is measured by a scanning probe microscope (model: SPA400, manufactured by Seiko Instruments Inc.). The Ra can be calculated from the measured flat profile.

Note that when the arithmetic mean roughness (Ra) of the cohesive layer is measured, a measurement region may be set so as not to pick up the concave-convex shape when the first principal surface 2 has the concave-convex shape. If the diameter of the circular pore and the root mean square roughness (RMS) are in the above-stated preferable ranges, the Ra of the cohesive layer can be measured by, for example, setting the measurement region at a region excluding edge lines of concave-convex.

When the first principal surface 2 of the glass substrate 5 has the concave-convex shape, the root mean square roughness (RMS) of the layer of the cohesive layer 6 which is in contact with the antifouling layer 7 is preferably 10 nm or more, and more preferably 20 nm or more as a lower limit value. As an upper limit value thereof, it is preferably 1500 nm or less, more preferably 1000 nm or less, further preferably 500 nm or less, and particularly preferably 200 nm or less. If the RMS is in the above-stated range, not only the peeling of the antifouling layer 7 is suppressed and the abrasion resistance is improved, but also the antidazzle property and the antiglare property are enabled. When the RMS of the concave-convex shape is measured, the measurement region may be selected such that a lot of circular pores are sufficiently included, which is in contradiction to the above-stated measurement of the arithmetic mean roughness (Ra) of the cohesive layer 6. Besides, as stated above, the surface roughnesses of the cohesive layer 6 and the antifouling layer 7 are enough smooth, and therefore, it can be regarded that a value of the RMS measured by the above-stated method under a state where the cohesive layer 6 and the antifouling layer 7 exist is the same value as the RMS of the concave-convex shape.

Besides, as it is described later, when a thickness of the antifouling layer 7 is approximately 2 nm to 20 nm, a concave-convex structure of the surface of the antifouling layer 7 is formed by tracing a surface shape of the cohesive layer 6 as it is because the thickness of the antifouling layer 7 is thin. Accordingly, the arithmetic mean roughness (Ra) of the antifouling layer 7 is identifiable with the Ra of the cohesive layer 6. Besides, the root mean square roughness (RMS) of the antifouling layer 7 is also identifiable with the RMS of the cohesive layer 6. Accordingly, the surface roughness (the Ra or the RMS) of the cohesive layer 6 can be measured by the Ra or the RMS of the glass substrate with the antifouling layer 1 after the antifouling layer 7 is formed. Incidentally, when the first principal surface 2 of the glass substrate 5 has the concave-convex shape, it is preferable that the measurement region is selected such that a minute region of; for example, approximately 1 μm×1 μm is selected to be measured so as not to measure the concave-convex shape when the Ra or the RMS of the antifouling layer 7 is measured.

(Low-Reflection Film)

The low-reflection film is a film which brings about an effect of reflectance reduction, reduces glare due to reflection of light, in addition, improves transmittance of light from the image display device, and improves visibility of the image display device when it is used for the image display device. The glass substrate with the antifouling layer 1 of the embodiment preferably includes the low-reflection film between the first principal surface 2 and the antifouling layer 7. As a constitution of the low-reflection film, it is not particularly limited as long as it has the constitution capable of suppressing reflection of light, and for example, it may have the constitution where a high refractive index layer whose refractive index at a wavelength of 550 nm is 1.9 or more and a low refractive index layer whose refractive index at a wavelength of 550 nm is 1.6 or less are laminated. Besides, it may have the constitution of only one layer of the low refractive index layer.

The low-reflection film may include one of the high refractive index layer and one of the low refractive index layer, or may include two or more of the high refractive index layers and two or more of the low refractive index layers. When two layers or more of each of the high refractive index layers and the low refractive index layers are included, it is preferably in a mode where the high refractive index layers and the low refractive index layers are alternately laminated.

The low-reflection film is preferably a laminate where a plurality of layers are laminated in order to increase the low reflective property. For example, the number of layers to be laminated of the laminate is preferably two layers or more and eight layers or less as a total, more preferably two layers or more and six layers or less, and further preferably two layers or more and four layers or less. The laminate described here is preferably the laminate where the high refractive index layers and the low refractive index layers are laminated as stated above, and a total sum of the number of layers of each of the high refractive index layers and the low refractive index layers is preferably in the above-stated range.

Materials of the high refractive index layer and the low refractive index layer are not particularly limited, and they can be appropriately selected in consideration of a degree of required low reflective property, productivity, and so on. As the material composing the high refractive index layer, for example, there can be preferably used one kind or more selected from a niobium oxide ($Nb_2O_5$), a titanium oxide ($TiO_2$), a zirconium oxide ($ZrO_2$), a tantalum oxide ($Ta_2O_5$), and a silicon nitride ($Si_3N_4$). As the material composing the low refractive index layer, there can be preferably used one kind or more selected from the silicon oxide ($SiO_2$), a material containing a mixed oxide of Si and Sn, a material containing a mixed oxide of Si and Zr, and a material containing a mixed oxide of Si and Al.

The constitution is preferable where the high refractive index layer is a layer made of one kind selected from the niobium oxide, the tantalum oxide, and the silicon nitride, and the low refractive index layer is a layer made of the silicon oxide, from viewpoints of the productivity and the refractive index.

(Antifouling Layer 7)

The antifouling layer 7 is a film which suppresses adhesion of organic matters and inorganic matters to a surface thereof, or a layer which brings about an effect where adherents are easy to be removed by cleaning such as wiping even when the organic matters and the inorganic matters are adhered to the surface.

The antifouling layer 7 is formed on the surface of the cohesive layer 6. As the antifouling layer 7, it is not particularly limited as long as the antifouling property can be supplied to the obtained glass substrate with the antifouling layer 1 by having, for example, the water repellency or the oil repellency. It is preferable that the antifouling layer 7 is made of the fluorine-containing organosilicon compound film obtained by curing the fluorine-containing organosilicon compound by the hydrolysis and condensation reaction.

A thickness of the antifouling layer 7 is not particularly limited, but when the antifouling layer 7 is made of the fluorine-containing organosilicon compound film, a film thickness on the first principal surface 2 is preferably 2 nm to 20 nm, more preferably 2 nm to 15 nm, and further preferably 2 nm to 10 nm. When the film thickness on the first principal surface 2 is 2 nm or more, it becomes a state where the surface of the first principal surface 2 of the glass substrate 5 is uniformly covered by the antifouling layer 7, and it is endurable to practical use from a viewpoint of scratch resistance. Besides, when the film thickness on the first principal surface 2 is 20 nm or less, optical characteristics such as the haze value of the glass substrate with the antifouling layer 1 under the state where the antifouling layer 7 is formed are fine.

As a method to form the fluorine-containing organosilicon compound film, there can be cited a method where a composition of a silane coupling agent having a fluoroalkyl group such as a perfluoroalkyl group or a fluoroalkyl group containing a perfluoro(polyoxyalkylene) chain is coated on the surface of the cohesive layer 6 formed on the first principal surface 2 of the glass substrate 5 by a spin coating method, a dip coating method, a casting method, a slit coating method, a spray coating method, and so on, and thereafter, heat treatment is performed according to need, a vacuum deposition method where the fluorine-containing organosilicon compound is vapor-phase deposited on the surface of the cohesive layer 6, and thereafter, the heat treatment is performed according to need, and so on. It is preferable to form by the vacuum deposition method to obtain the fluorine-containing organosilicon compound film with high cohesiveness. The formation of the fluorine-containing organosilicon compound film by the vacuum deposition method is preferably performed by using a film-forming composition containing the fluorine-containing hydrolyzable silicon compound.

The film-forming composition is a composition containing the fluorine-containing hydrolyzable silicon compound, and it is not particularly limited as long as it is the composition where a film formation by the vacuum deposition method is possible. The film-forming composition may contain an arbitrary component other than the fluorine-containing hydrolyzable silicon compound, or may be composed of only the fluorine-containing hydrolyzable silicon compound. As the arbitrary component, there can be cited a hydrolyzable silicon compound which does not have fluorine atoms (hereinafter, called as a "non-fluorine hydrolyzable silicon compound), a catalyst, and so on which are used within a range not disturbing the effects of the present invention.

Note that when the fluorine-containing hydrolyzable silicon compound and arbitrarily the non-fluorine hydrolyzable silicon compound are compounded to the film-forming composition, each compound may be compounded as it is or as a partially hydrolyzed condensate. Besides, a mixture of the compound and the partially hydrolyzed condensate may be compounded to the film-forming composition.

Besides, when two kinds or more of the hydrolyzable silicon compounds are combined to be used, each compound may be compounded to the film-forming composition as it is, as a partially hydrolyzed condensate, or as a partially hydrolyzed co-condensate of two kinds or more of the compounds. Besides, it may be a mixture of the compound, the partially hydrolyzed condensate, and the partially hydrolyzed co-condensate of these. Note that the used partially hydrolyzed condensate and partially hydrolyzed co-condensate each have a degree of polymerization capable of performing the vacuum deposition. Hereinafter, a term of the hydrolyzable silicon compound is used in a meaning including the partially hydrolyzed condensate and the partially hydrolyzed co-condensate in addition to the compound in itself.

(Fluorine-Containing Hydrolyzable Silicon Compound)

The fluorine-containing hydrolyzable silicon compound used for the formation of the fluorine-containing organosilicon compound film of the present invention is not particularly limited as long as the obtained fluorine-containing organosilicon compound film has the antifouling properties such as the water repellency or the oil repellency.

Specifically, there can be cited the fluorine-containing hydrolyzable silicon compound having one or more groups selected from a group of a perfluoropolyether group, a perfluoroalkylene group, and a perfluoroalkyl group. These groups exist as a fluorine-containing organic group which is bonded to silicon atoms of the hydrolyzable silyl group through a linking group or directly. As a commercially available fluorine-containing organosilicon compound (fluorine-containing hydrolyzable silicon compound) having one or more groups selected from a group of the perfluoropolyether group, the perfluoroalkylene group, and the perfluoroalkyl group, there can be preferably used such as KP-801 (brand name, manufactured by Shin-Etsu Chemical Co., Ltd.), X-71 (brand name, manufactured by Shin-Etsu Chemical Co., Ltd.), KY-130 (brand name, manufactured by Shin-Etsu Chemical Co., Ltd.), KY-178 (brand name, manufactured by Shin-Etsu Chemical Co., Ltd.), KY-185 (brand name, manufactured by Shin-Etsu Chemical Co., Ltd.), KY-195 (brand name, manufactured by Shin-Etsu Chemical Co., Ltd.), Afluid (registered trademark) S-550 (brand name, manufactured by Asahi Glass Co., Ltd.), OPTOOL (registered trademark) DSX (brand name, manufactured by DAIKIN Industries, Ltd.), and so on. Among the above, it is more preferable to use KY-185, KY-195, OPTOOL DSX, and S-550.

Note that when the commercially available fluorine-containing hydrolyzable silicon compound is supplied together with a solvent, it is used by removing the solvent. The film-forming composition used in the present invention is prepared by mixing the above-stated fluorine-containing hydrolyzable silicon compound and the arbitrary component added according to need, and supplied to the vacuum deposition.

The film-forming composition containing the fluorine-containing hydrolyzable silicon compound as stated above is adhered and reacted to the surface of the cohesive layer 6 to be film-formed, and thereby, the fluorine-containing organosilicon compound film is obtained. Note that as for the concrete vacuum deposition method and the reaction conditions, conventionally publicly known methods, conditions, and so on are applicable.

In the glass substrate with the antifouling layer 1 illustrated in FIG. 1, the cohesive layer 6 and the antifouling layer 7 are provided only on the first principal surface 2, but they may be further provided on the end face 4. For example, the cohesive layer 6 and the antifouling layer 7 may extend in a region from the first principal surface 2 to the end face 4 of the glass substrate 5. In this case, the cohesive layer 6 and the antifouling layer 7 are provided on the most of the first principal surface 2 and the most of the end face 4 in a mode where both layers can exhibit respective functions. It is thereby possible to suppress occurrence of microcracks at the end face 4, and to supply high strength to the glass substrate with the antifouling layer 1.

Figure 2:
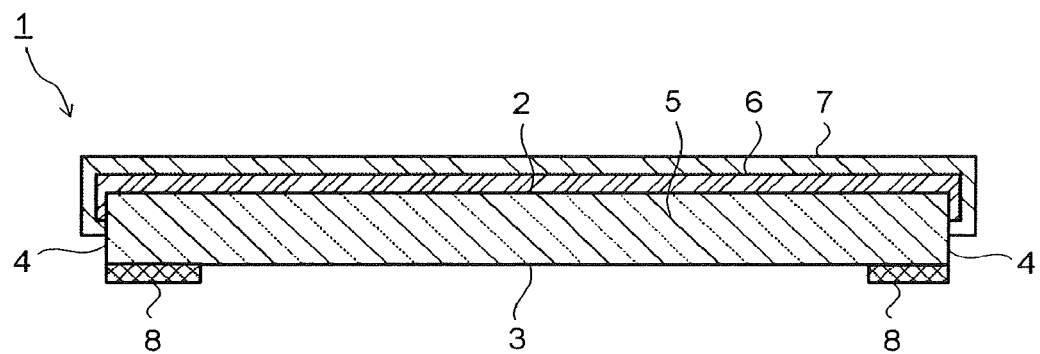
FIG. 2 is a sectional view schematically illustrating a glass substrate with an antifouling layer of another embodiment.

Besides, when the cohesive layer 6 and the antifouling layer 7 are provided also on the end face 4 in addition to the first principal surface 2 of the glass substrate 5, either one of the cohesive layer 6 or the antifouling layer 7 may be provided on the end face 4. FIG. 2 is a view illustrating an example of the glass substrate with the antifouling layer where the antifouling layer 7 is directly provided on a part of the end face 4 without being intervened by the cohesive layer 6. The antifouling layer 7 may be directly formed on the end face 4 without being formed on the cohesive layer 6, and the antifouling layer 7 may be formed either on a part or a whole of the end face 4. In this case, the microcracks at the end face 4 are suppressed by the antifouling layer 7, and therefore, high strength can be supplied to the glass substrate with the antifouling layer 1.

Note that the cohesive layer 6 and the antifouling layer 7 may continuously extend up to a vicinity of an outer periphery of an uppermost surface of the glass substrate 5 at the second principal surface 3 side. In this case, further high strength can be supplied to the glass substrate with the antifouling layer 1.

(Printed Layer 8)

The printed layer 8 is provided according to need so as to conceal wiring circuits disposed in a vicinity of an outer periphery of a display device of a portable equipment and an adhesive part between a casing of the portable equipment and the glass substrate with the antifouling layer 1, and so on, for example, for the purpose of increasing visibility and beauty of the display. Here, a peripheral edge part means a band-shaped region with a predetermined width from an outer periphery toward a center part. The printed layer 8 may be provided on a whole peripheral edge of the second principal surface 3, or on a part of the peripheral edge.

When the glass substrate with the antifouling layer 1 includes the printed layer 8, the printed layer 8 can be appropriately set with a width capable of concealing, for example, the wiring circuits and the adhesive part. Besides, a color of the printed layer 8 is not particularly limited, and a desired color thereof can be selected in accordance with each purpose. The printed layer 8 is formed by a method to print ink.

As the ink, it is not particularly limited, and can be selected according to the color of the printed layer 8 to be formed. For example, there may be used either an inorganic ink containing a ceramic calcined body or the like or an organic ink containing an organic resin and a coloring material such as dye or pigment.

For example, when the printed layer 8 is formed by black, there can be cited an oxide such as a chromium oxide or an iron oxide, a carbide such as a chromium carbide or a tungsten carbide, carbon black, mica, and so on as the ceramics contained in the black inorganic ink. The black printed layer 8 is obtained by melting an ink made of the ceramics and silica, printing that with a desired pattern, and thereafter drying. This inorganic ink requires melting and drying processes, and is generally used as a glass dedicated ink.

The organic ink is a composition containing the organic resin and the dye or the pigment with a desired color. As the organic resin, there can be cited an epoxy-based resin, an acrylic-based resin, polyethylene terephthalate, polyethersulfone, polyarylate, polycarbonate, an acrylonitrile-butadiene-styrene (ABS) resin, a phenol resin, a transparent ABS resin, a homopolymer such as polyurethane, polymethylmethacrylate, polyvinyl, polyvinylbutyral, polyetheretherketone, polyethylene, polyester, polypropylene, polyamide, polyimide, and a resin made of a copolymer of a monomer of these resins and a monomer capable of copolymerized with the monomer of these resins.

Between the above-stated inorganic ink and the organic ink, usage of the organic ink is preferable because a drying temperature thereof is low. Besides, the organic ink containing pigment is preferable from a viewpoint of chemical resistance.

[Properties of Glass Substrate with Antifouling Layer]
(Water Contact Angle)
A water contact angle of the glass substrate with the antifouling layer 1 is preferably 90° to 130°, and more preferably 100° to 120°. The water contact angle is in the above-stated range, and thereby, the glass substrate with the antifouling layer 1 exhibits excellent antifouling property. Note that the water contact angle is a value of a contact angle relative to water, and for example, water droplets of pure water of approximately 1 µL are dropped on an uppermost surface of the first principal surface 2 of the glass substrate with the antifouling layer 1, and then the water contact angle can be measured by a contact angle meter.

[Manufacturing Method of Glass Substrate with Antifouling Layer]
Next, a manufacturing method of the glass substrate with the antifouling layer 1 is described. The glass substrate with the antifouling layer 1 including the above-stated cohesive layer 6 and antifouling layer 7 is, for example, manufactured as described below. At first, a carrier substrate is adhered to the glass substrate 5 at the second principal surface 3 side through an adhesive. Further, the cohesive layer 6 and the antifouling layer 7 are sequentially formed on the first principal surface 2 under a state where the carrier substrate is adhered, and the glass substrate with the antifouling layer 1 is manufactured.

In the manufacturing method of the glass substrate with the antifouling layer 1, it is preferable that the antiglare treatment and the chemical strengthening treatment are performed for the first principle surface 2 of the glass substrate 5 before the adhesive and the carrier substrate are adhered. Further, the printed layer 8 is formed on the glass substrate 5 at the second principal surface 3 side according to need.

Hereinafter, each step of the manufacturing method of the glass substrate with the antifouling layer 1 of the present invention is described.

(Antiglare Treatment)
As the antiglare treatment, a method is not particularly limited as long as the concave-convex shape capable of supplying the antiglare property can be formed, and a publicly known method can be used. For example, there can be used a method where a surface treatment is performed for the first principal surface 2 of the glass substrate 5 by a chemical method or a physical method to form the concave-convex shape with desired surface roughness as the antiglare treatment. Besides, a coating liquid for an antiglare film is coated or sprayed on the first principle surface 2 of the glass substrate 5, and then the antiglare film is deposited on the glass substrate 5 to supply the concave-convex shape, as the antiglare treatment.

As the antiglare treatment by the chemical method, specifically, there can be cited a method performing a frost treatment. The frost treatment is performed by, for example, immersing the glass substrate 5 that is a treatment object into a mixed solution of hydrogen fluoride and ammonium fluoride.

Besides, as the antiglare treatment by the physical method, there are performed by, for example, what is called a sand-blast process where a crystalline silicon dioxide powder, a silicon carbide powder, and so on are blasted to the surface of the glass substrate 5 by using pressurized air, a method where a brush having the crystalline silicon dioxide powder, the silicon carbide powder, and so on adhered thereto is moistened with water, and then the surface of the glass substrate 5 is polished by using the brush, and so on Among them, the frost treatment that is the chemical surface treatment can be preferably used, because microcracks are difficult to occur at the surface of the treatment object, and the lowing of the strength of the glass substrate 5 is difficult to occur.

Further, it is preferable to perform an etching treatment for the first principal surface 2 of the glass substrate 5 where the antiglare treatment has been performed in order to regulate the surface shape. As the etching treatment, for example, there can be used a method where the glass substrate 5 is immersed in an etching solution that is an aqueous solution of hydrogen fluoride to chemically perform the etching. The etching solution may contain an acid such as a hydrochloric acid, a nitric acid, and a citric acid in addition to hydrogen fluoride. These acids are contained in the etching solution, and thereby, it is possible to suppress a local occurrence of precipitates due to a reaction between cation components such as Na ions and K ions contained in the glass substrate 5 and hydrogen fluoride, and to uniformly proceed the etching in a treatment surface.

When the etching treatment is performed, an etching amount is adjusted by adjusting a concentration of the etching solution, an immersion time of the glass substrate 5 into the etching solution, and so on, and thereby, the haze value of an antiglare treatment surface of the glass substrate 5 can be adjusted to a desired value. Besides, when the antiglare treatment is performed by the physical surface treatment such as the sand-blast process, there is a case when cracks occur, but the cracks can be removed by the etching treatment. Besides, an effect to suppress dazzle of the glass substrate with the antifouling layer 1 can also be obtained by the etching treatment. When the glass substrate 5 is cut into a desired size, it is preferable to be cut after the antiglare treatment is performed and before the next chemical strengthening treatment is performed.

As the antiglare treatment, there can be used publicly known wet coating methods (the spray coating method, an electrostatic coating method, the spin coating method, the dip coating method, a die coating method, a curtain coating method, a screen coating method, an ink-jet method, a flow coating method, a gravure coating method, a bar coating method, a flexo coating method, the slit coating method, a roll coating method, and so on) or the like, as a method of coating the coating liquid for the antiglare film.

Among them, there can be cited the spray coating method and the electrostatic coating method (electrostatic spray method) as excellent methods to deposit the antiglare film. The antiglare film can be formed by treating the glass substrate 5 by using the coating liquid for the antiglare film by a spraying apparatus, and thereby, the antiglare treatment of the glass substrate 5 is performed. According to the spray coating method, it is possible to change the haze value or the like at a wide range. This is because it is relatively easy to form the concave-convex shape necessary for obtaining required characteristics by flexibly changing a coating amount of the coating liquid and a material constitution. In particular, the electrostatic coating method (electrostatic spray method) is more preferable.

Particles may be contained in the coating liquid for the antiglare film. As the particles, there can be used metal oxide particles, metal particles, pigment-based particles, resin-based particles, and so on.

As a material of the metal oxide particles, there can be cited $Al_2O_3$, $SiO_2$, $SnO_2$, $TiO_2$, $ZrO_2$, ZnO, $CeO_2$, Sb-containing $SnO_X$ (antimony-containing tin oxide, ATO), Sn-containing $In_2O_3$ (ITO), $RuO_2$, and so on. $SiO_2$ is preferable because the refractive index thereof is the same as that of the matrix.

As a material of the metal particles, there can be cited metals (Ag, Ru, and so on), alloys (AgPd, RuAu, and so on), and so on.

As a material of the pigment-based particles, there can be cited inorganic pigments (titanium black, carbon black, and so on), and organic pigments.

As a material of the resin-based particles, there can be cited an acrylic resin, a polystyrene resin, a melanin resin, and so on.

As a shape of the particle, there can be cited a scale shape, a spherical shape, an ellipse shape, a needle shape, a plate shape, a bar shape, a conical shape, a column shape, a cube shape, a parallelepiped shape, a diamond shape, a star shape, an indeterminate shape, and so on. Other particles may exist under a state where each particle is independent, each particle may be bonded in a chain state, or each particle may be aggregated. Particles may be solid particles, hollow particles, or perforated particles such as porous particles.

As the scale-shaped particles, there can be cited scale-shaped silica ($SiO_2$) particles, scale-shaped alumina ($Al_2O_3$) particles, scale-shaped titania ($TiO_2$) particles, scale-shaped zirconia ($ZrO_2$) particles, and so on, and the scale-shaped silica particles are preferable from a point capable of suppressing increase in the refractive index of the film, and lowering the reflectance.

As other particles, silica particles such as spherical-shaped silica particles, bar-shaped silica particles, needle-shaped silica particles are preferable. Among them, the spherical-shaped silica particles are preferable, and the porous spherical-shaped silica particles are more preferable from points that haze of the glass substrate with the antiglare film becomes sufficiently high, 60° specular glossiness of the surface of the antiglare film becomes sufficiently low, and as a result, the antiglare effect is sufficiently exhibited.

In the electrostatic coating method, the coating liquid for the antiglare film is charged and sprayed by using an electrostatic coating apparatus including an electrostatic coating gun. Liquid droplets of the coating liquid for the antiglare film sprayed from the electrostatic coating gun have a minus electric charge, and therefore, the liquid droplets are drawn toward a grounded glass base material due to electrostatic attraction. Accordingly, it is efficiently adhered on the glass substrate 5 compared to a case when it is sprayed without being charged.

One kind of the antiglare treatment method may be independently performed, or two kinds or more may be combined to be performed. For example, the antiglare treatment by the etching treatment, the spray coating method using the coating liquid, and so on are normally independently performed, but they may be used together.

(Chemical Strengthening Treatment)
As a chemical strengthening treatment method, it is not particularly limited, and the surface of the glass substrate 5 is ion-exchanged to form a surface layer where a compressive stress remains. Specifically, an alkali metal ion whose ion radius is small (for example, Li ions, Na ions) contained in the glass at the surface of the glass substrate 5 are exchanged into the alkali metal ion whose ion radius is larger (for example, Na ions or K ions relative to Li ions, and K ions relative to Na ions) at a temperature lower than a glass transition point. The compressive stress thereby remains at the surface of the glass substrate 5, and the strength of the glass substrate 5 is improved.

(Formation of Printed Layer 8)
After that, for example, an ink is printed at the second principal surface 3 side of the glass substrate 5, and the printed layer 8 is formed. The formation of the printed layer 8 is not essential, and is appropriately performed according to need. As a printing method, there are the bar coating method, a reverse coating method, the gravure coating method, the die coating method, the roll coating method, a screen printing method, and so on. Among them, the screen printing method is preferable because it is easy to print, printing on various base materials is possible, and it is possible to print according to a size of the glass substrate 5. The printed layer 8 may be made of multiple layers where a plurality of layers are laminated, or may be made of a single layer. When the printed layer 8 is made of multiple layers, the printed layer 8 is formed by repeating the above-stated printing of ink, and drying.

(Adhesive, Adherence of Carrier Substrate)
Next, an adhesive made of a carbon-containing material is adhered on the second principal surface 3 of the glass substrate 5 where the printed layer 8 is formed, and further, the carrier substrate is adhered to the surface of the adhesive. At this time, the adhesive is preferably disposed so as to be exposed from the outer periphery of the glass substrate 5.

Figure 3:
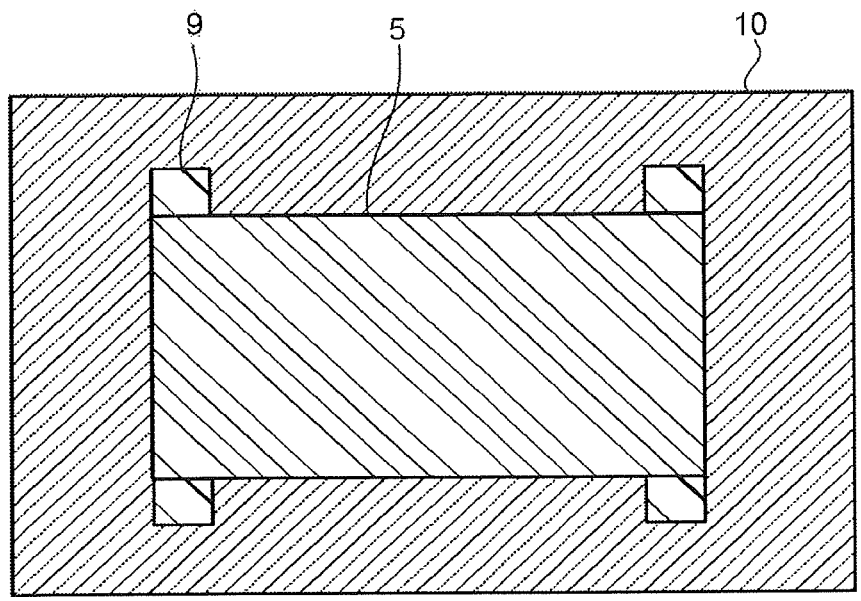
FIG. 3 is a plan view schematically illustrating the glass substrate under a state where an adhesive and a carrier substrate are adhered.

An example of disposition of an adhesive 9 and a carrier substrate 10 relative to the glass substrate 5 when the adhesive 9 and the carrier substrate 10 are adhered is schematically illustrated in FIG. 3. In FIG. 3, the band-shaped adhesive 9 is adhered to the surface of the printed layer 8 formed on the second principal surface 3 of the glass substrate 5, and the carrier substrate 10 is adhered through the adhesive 9.

In FIG. 3, the adhesive 9 is disposed such that both ends in a longitudinal direction thereof are exposed from the outer periphery of the glass substrate 5. Subsequently, film-formation of the silicon oxide layer which constitutes the cohesive layer 6 is performed as described below under a state where the adhesive 9 is exposed from the outer periphery of the glass substrate 5. The carbon-containing material is volatilized from the part of the adhesive 9 exposed from the outer periphery of the glass substrate 5 due to the heating or the plasma when the silicon oxide layer is formed, then the carbon-containing material is taken into the silicon oxide layer to form the carbon-containing silicon oxide layer.

A shape of the adhesive 9 is not particularly limited, and it may be a hook shape or the like in addition to the band shape illustrated in FIG. 3. Besides, the adhesive 9 may be adhered on the glass substrate 5 continuously or intermittently.

Besides, the glass substrate 5 illustrated in FIG. 3 has the printed layer 8, and therefore, the adhesive 9 is adhered on the surface of the printed layer 8. When the printed layer 8 is not provided on the glass substrate 5, the adhesive 9 is directly adhered to the second principal surface 3.

Besides, the dispositions of the adhesive 9 and the carrier substrate 10 relative to the glass substrate 5 are not particularly limited as long as the glass substrate 5 is held by the carrier substrate 10 under a state where the adhesive 9 is exposed from the outer periphery of the glass substrate 5. For example, the adhesive 9 and the carrier substrate 10 may be disposed at a whole surface on the second principal surface 3, or at a part thereof; further they may be disposed in either the continuous mode of or the intermittent mode. The number of glass substrates 5 held by the carrier substrate 10 is not also particularly limited, and one or a plurality of glass substrates 5 are held by one carrier substrate 10.

Figure 4:
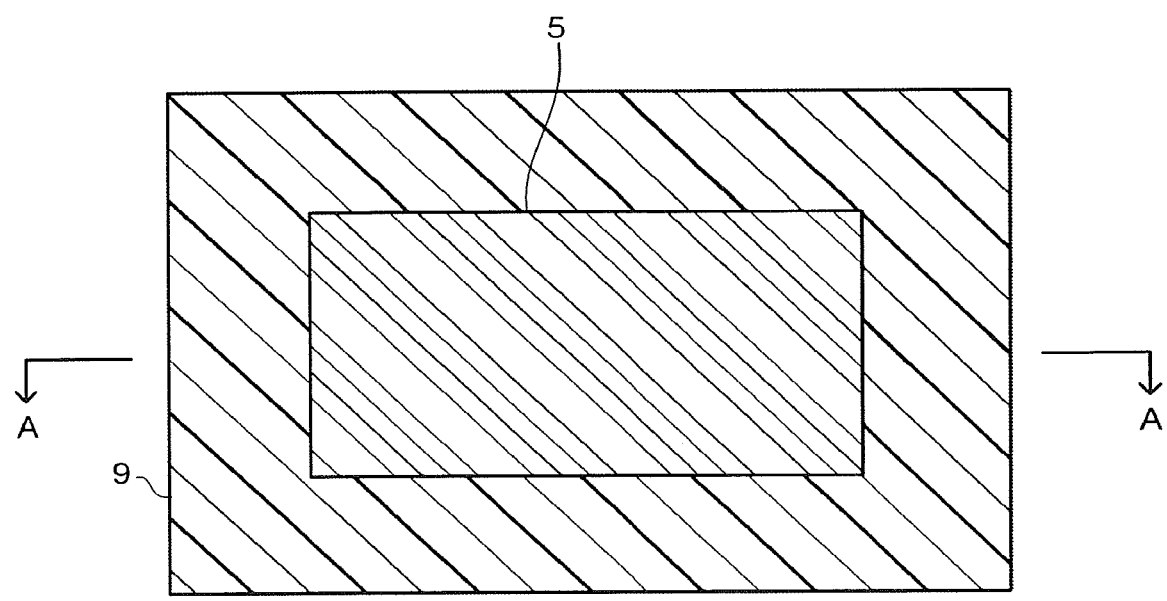
FIG. 4 is a plan view schematically illustrating the glass substrate under the state where the adhesive and the carrier substrate are adhered according to another embodiment.
Figure 5:
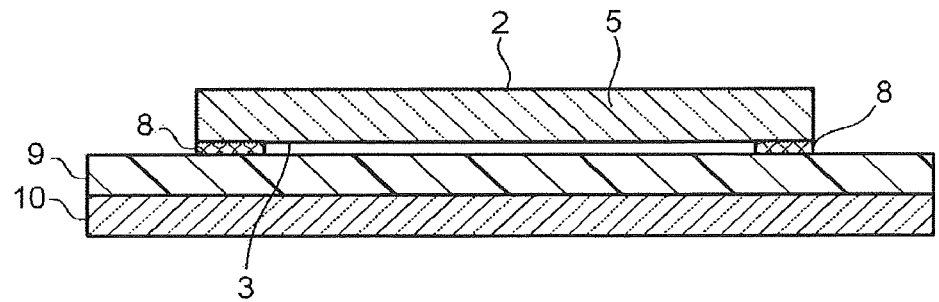
FIG. 5 is a sectional view taken along an A-A line of the glass substrate illustrated in FIG. 4.

Another example of disposition of the adhesive 9 and the carrier substrate 10 relative to the glass substrate 5 when the adhesive 9 and the carrier substrate 10 are adhered is schematically illustrated in FIG. 4. FIG. 5 is a sectional view taken along an A-A line of the glass substrate illustrated in FIG. 4. In FIG. 4, the adhesive 9 is adhered to the whole surface of the carrier substrate 10 at the glass substrate 5 side, and the glass substrate 5 is adhered on the adhesive 9. As stated above, the adhesive 9 is adhered to one principal surface of the carrier substrate 10 wholly, and the glass substrate 5 may be thereby adhered.

Besides, the adhesive 9 made of the carbon-containing material is to be exposed to the heating or the plasma when the silicon oxide layer is formed. Accordingly, the adhesive 9 is not limited to a mode adhered to the glass substrate 5, but for example, may be separately disposed on a principal surface of the carrier substrate 10 at a side where the glass substrate 5 is adhered independent of the glass substrate 5.

As for an exposed amount of the adhesive 9, an area of the exposed part is preferably 1 area % to 50 area %, and more preferably 1 area % to 20 area % relative to an area of the first principal surface 2 of the glass substrate 5 though it depends on a material of the adhesive 9. It is thereby possible to make carbon atoms contain in the silicon oxide layer at the above-stated predetermined concentration.

(Adhesive 9)

As the material of the adhesive 9, there can be cited a silicone-based adhesive using a silicone rubber and a silicone resin, an acrylic-based adhesive which is synthesized by polymerizing or copolymerizing one kind or more of acrylic ester monomers, a polyurethane-based adhesive using polyurethane, and so on. Here, when the glass substrate with the antifouling layer 1 is assembled to a portable equipment or the like, the second principal surface 3 side of the glass substrate with the antifouling layer 1 is adhered to a display device or a casing of the portable equipment or the like by the adhesive or the like. Accordingly, the second principal surface 3 preferably has low water repellency or low oil repellency from a viewpoint of adhesiveness. The material of the adhesive 9 is therefore preferably the acrylic-based and the polyurethane-based adhesive 9 among the above-stated materials.

An adhesive power of the adhesive 9 is preferably 0.02 N/25 mm to 0.4 N/25 mm, and more preferably 0.05 N/25 mm to 0.2 N/25 mm in terms of a value of 180-degree peeling and adhesion measurement to an acrylic plate defined by JIS Z 0237 from a point of a balance of adhesive forces between the glass substrate 5 and the printed layer 8 and between the printed layer 8 and the carrier substrate 10, and removability of the adhesive 9 when the adhesive 9 and the carrier substrate 10 are removed after the antifouling layer is film-formed.

A thickness of the adhesive 9 is preferably 5 μm to 50 μm from a viewpoint of the adhesive forces between the glass substrate 5 and the printed layer 8 and between the printed layer 8 and the carrier substrate 10, and the removability.

Besides, the carbon-containing materials other than the adhesive 9 may be disposed on the carrier substrate in addition to the glass substrate 5. In the cases, it is possible to adjust an amount of carbon contained in the silicon oxide layer by an amount of the carbon-containing materials of the adhesive 9 or other than the adhesive 9 which are disposed in addition to the glass substrate 5. The amount of the carbon-containing materials of the adhesive 9 or other than the adhesive 9 disposed in addition to the glass substrate 5 may be set to be, for example, the same as the exposed amount of the adhesive 9.

As the carbon-containing materials other than the adhesive 9, for example, there can be used resins such as the polyethylene terephthalate (PET) resin, the polyethylene resin, the polypropylene resin, grease (fats and oils), and so on when carbon atoms are to be contained in the silicon oxide layer. In this case, a shape of the resin is not particularly limited, and the shape such as a film shape, a block shape, or the like can be appropriately designed according to manufacturing conditions or the like.

Besides, it is possible to form a layer where a desired element is taken into the silicon oxide layer by selecting the material of the adhesive 9 or using the material other than the adhesive 9. A component contained in the material of the adhesive 9 or the material other than the adhesive 9 is volatilized by being exposed to the heating or the plasma at the time of forming the silicon oxide layer, and thereby, a layer where the component is taken into the silicon oxide layer is formed.

When atoms other than carbon atoms are to be contained in the silicon oxide layer, for example, when fluorine atoms are to be contained, an adhesive containing fluorine or a fluorine-containing material other than the adhesive 9 is disposed on a principal surface of the carrier substrate 10 at a side where the glass substrate 5 is adhered in addition to the glass substrate 5. As the fluorine-containing material in this case, there can be used fluorine-containing resins such as a polytetrafluoroethylene (PTFE) resin, a tetrafluoroethylene-perfluoroalkoxyethylene copolymer (PFA) resin, a tetrafluoroethylene-ethylene copolymer (ETFE) resin, and a fluorine-containing grease. In this case, a shape of the fluorine-containing resin is not particularly limited, and the shape such as a film shape, a block shape, or the like can be appropriately designed according to manufacturing conditions or the like.

(Carrier Substrate 10)

As the carrier substrate 10, it is not particularly limited as long as it is the material having strength capable of keeping a vertical state or a horizontal state while holding the glass substrate 5, and capable of enduring conditions such as a temperature, a pressure and an atmosphere at the formation of the cohesive layer 6 and the antifouling layer 7, and ones made of a glass, a resin, a metal, and so on can be used for the carrier substrate 10. As a shape of the carrier substrate 10, a substrate in a plate shape or a film shape can be used. Note that when the glass substrate 5 has the curved surface, the carrier substrate 10 may be processed into a shape corresponding to the shape of the second principal surface 3 of the glass substrate 5.

As the resin carrier substrate 10, specifically, there are suitably used the polyethylene terephthalate (PET) resin, the polyethylene resin, and the polypropylene resin. As the resin carrier substrate 10, the PET resin is preferable from a viewpoint of heat resistance. As the resin carrier substrate 10, it is preferably in the film shape, and the film of the above-stated resin is suitably used.

Besides, the carrier substrate 10 where the adhesive 9 is provided in advance may be used such as a protective film with an adhesive. In this case, after the film with the adhesive is continuously supplied and mounted on the second principal surface 3 by using a laminator or the like while conveying the glass substrate 5, that is pressurized to be adhered. Lamination conditions at this time are not particularly limited, and the lamination is performed under conditions of, for example, a convey velocity of the glass substrate 5 of 1 mm/min to 5 mm/min, a pressurizing force of 1 kgf/cm$^2$ to 10 kgf/m$^2$ in terms of line pressure.

As the carrier substrate 10 where the adhesive 9 is provided, there can be used No. 6500 (brand name, manufactured by Hitachi Maxell, Ltd.) or the like as a polyimide tape with a silicone-based adhesive, RP-207 (brand name, manufactured by Nitto Denko Corporation) or the like as a PET film with an acrylic-based adhesive, UA-3004AS (brand name, manufactured by Sumiron Co., Ltd.) or the like as a PET film with a polyurethane-based adhesive. The carrier substrate 10 having the adhesive 9 as stated above is used, and thereby, it is possible to effectively perform the holding of the substrate and the introduction of carbon.

Besides, when the adhesive 9 has sufficient holding strength relative to the glass substrate 5, it is not necessary to use the carrier substrate 10 because the adhesive 9 also has the function of the carrier substrate 10.

A size of the carrier substrate 10 is not particularly limited, but the carrier substrate 10 is preferably larger than the second principal surface 3 of the glass substrate 5 from a point of the holding strength of the glass substrate 5. When the carrier substrate 10 is larger than the glass substrate 5, and for example, when the cohesive layer 6 is formed by sputtering, a material forming the cohesive layer goes around to the end face 4 in a process when the sputtering is performed, and the cohesive layer 6 is formed on the end face 4. Further, when the antifouling layer 7 is formed by vapor deposition, an antifouling layer forming material goes around to the end face 4 in a process when the vapor deposition is performed, and the antifouling layer 7 is formed on the end face 4. The cohesive layer 6 and the antifouling layer 7 are thereby formed in a region from the first principal surface 2 to the end face 4 of the glass substrate 5.

Besides, there may be used the carrier substrate 10 which is smaller than an area of the second principal surface 3. In this case, for example, the cohesive layer 6 is formed by sputtering and further the antifouling layer 7 is formed by vapor deposition under a state where the glass substrate 5 is adhered on the carrier substrate 10 whose area is smaller than the second principal surface 3, and thereby, it is possible to form the cohesive layer 6 and the antifouling layer 7 to a vicinity of an outer periphery of an uppermost surface at the second principal surface 3 side.

(Formation of Cohesive Layer 6)

The cohesive layer 6 is formed by sputtering a cohesive layer forming material toward the first principal surface 2 under the state where the carrier substrate 10 is adhered to the glass substrate 5. Next, the antifouling layer forming material is vapor-deposited toward the first principal surface 2 where the cohesive layer 6 is formed under the state where the glass substrate 5 is adhered to the carrier substrate 10, and thereby, the antifouling layer 7 is formed.

A method of film-forming each layer constituting the cohesive layer 6 is not particularly limited, and various film-forming methods can be used. For example, there can be used the vacuum deposition method, an ion beam assisted deposition method, an ion plating method, the sputtering method, a plasma CVD method, and so on. Among these film-forming methods, the sputtering method is preferably used because it is possible to form a dense film with high durability. In particular, it is preferably film-formed by the sputtering method such as a pulse sputtering method, an AC sputtering method, and a digital sputtering method.

For example, when the film-forming is performed by the pulse sputtering method, the glass substrate 5 is disposed in a chamber having a mixed gas atmosphere of inert gas and oxygen gas therein, and then targets are selected to be film-formed so as to be a desired composition as the cohesive layer forming material. In this case, a kind of the inert gas in the chamber is not particularly limited, and there can be used various inert gases such as argon and helium.

A pressure in the chamber by the mixed gas of the inert gas and the oxygen gas is not particularly limited, but the pressure is set to a range of 0.5 Pa or less, and thereby, it becomes easy to make fall surface roughness of the formed film within a preferable range. This is because of the reasons as described below. Namely, when the pressure in the chamber by the mixed gas of the inert gas and the oxygen gas is 0.5 Pa or less, a mean free path of film-forming molecules is secured, and the film-forming molecules with more energy reach the substrate. Accordingly, it is conceivable that reallocation of the film-forming molecules is accelerated, and a film having a relatively dense and smooth surface is formed. A lower limit value of the pressure in the chamber by the mixed gas of the inert gas and the oxygen gas is not particularly limited, but for example, the lower limit value is preferably 0.1 Pa or more.

When the high refractive index layer and the low refractive index layer are film-formed by the pulse sputtering method, it is possible to adjust a layer thickness of each layer by, for example, adjusting discharge power, and adjusting a film-forming time, and so on.

(Formation of Antifouling Layer 7)

Figure 6:
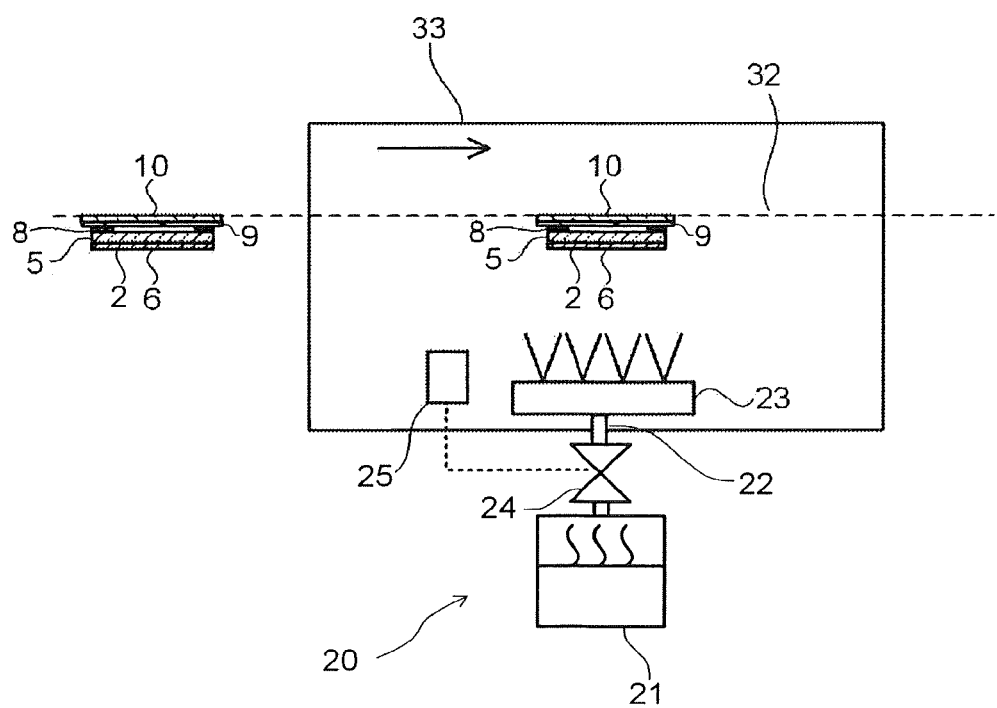
FIG. 6 is a view schematically illustrating an example of an apparatus to form the antifouling layer.

FIG. 6 is a view schematically illustrating an apparatus which can be used to form the antifouling layer 7 in the manufacturing method of the glass substrate with the antifouling layer 1 of the embodiment. The apparatus illustrated in FIG. 6 is an apparatus to deposit the composition containing the fluorine-containing hydrolyzable silicon compound on the first principal surface 2 of the glass substrate 5.

When the apparatus illustrated in FIG. 6 is used, the antifouling layer 7 is formed on the glass substrate 5 where the cohesive layer 6 is formed in a vacuum chamber 33 while the glass substrate 5 is conveyed from a left side to a right side in the drawing by a conveying unit 32, and thereby, the glass substrate 5 becomes the glass substrate with the antifouling layer 1.

In the vacuum chamber 33, the film-forming composition is adhered to the glass substrate 5 at the first principal surface 2 side by using a vacuum deposition apparatus 20 by the vacuum deposition method, in particular, a resistive heating method.

A pressure in the vacuum chamber 33 is preferably kept to be 1 Pa or less, more preferably 0.1 Pa or less from a viewpoint of production stability. The vacuum deposition by the resistive heating method can be performed without any problem if the pressure is in the above-stated range.

The vacuum deposition apparatus 20 includes a heating container 21 to heat the film-forming composition located outside the vacuum chamber 33, a pipe 22 to supply vapor of the film-forming composition from the heating container 21 to inside the vacuum chamber 33, and a manifold 23 connected to the pipe 22 and having an injection port to inject the vapor supplied from the heating container 21 to the first principal surface 2 of the glass substrate 5. Besides, in the vacuum chamber 33, the glass substrate 5 is held such that the injection port of the manifold 23 and the first principal surface 2 of the glass substrate 5 are faced with each other.

The heating container 21 has a heating unit capable of heating the film-forming composition that is a vapor deposition source to a temperature having a sufficient vapor pressure. Specifically, the heating temperature is preferably 30° C. to 400° C., and particularly preferably 150° C. to 350° C. though the heating temperature depends on kinds of the film-forming composition. When the heating temperature is a lower limit value or more in the above-stated range, a film-forming rate becomes good. When the heating temperature is an upper limit value or less in the above-stated range, the film having the antifouling property can be formed on the first principal surface 2 of the glass substrate 5 without decomposing the fluorine-containing hydrolyzable silicon compound.

Here, in the above-stated method, it is preferable to perform a pre-treatment to discharge the vapor outside the system for a predetermined time after the film-forming composition containing the fluorine-containing hydrolyzable silicon compound in the heating container 21 is heated to a vapor deposition start temperature at the time of vacuum vapor deposition. It is thereby possible to remove a low-molecular weight component or the like which is normally contained in the fluorine-containing hydrolyzable silicon compound and affects on the durability of the obtained film, and further stabilize a composition of raw material vapor supplied from the vapor deposition source, owing to this pre-treatment. It is thereby possible to stably form the fluorine-containing organosilicon compound film with high durability.

Specifically, a pipe (not-illustrated) which is connected to an openable and closable exhaust port to discharge initial vapor toward outside the system is provided at an upper part of the heating container 21 in addition to the pipe 22 which is connected to the manifold 23, and a method to trap the vapor at outside the system or the like may be performed.

Besides, a temperature of the glass substrate 5 at the time of vapor deposition is preferably in a range from a room temperature (20° C. to 25° C.) to 200° C. When the temperature of the glass substrate 5 is 200° C. or less, the film-forming rate becomes good. An upper limit value of the temperature of the glass substrate 5 is more preferably 150° C., and particularly preferably 100° C.

Besides, in order to control the film-forming rate, it is preferable to provide a variable valve 24 on the pipe 22, and to control an opening degree of the variable valve 24 based on a detected value of a thickness meter 25 provided inside the vacuum chamber 33. The configuration as stated above is provided, and thereby, it is possible to control an amount of vapor of the composition containing the fluorine-containing hydrolyzable silicon compound supplied to the first principal surface 2 of the glass substrate 5. It is thereby possible to accurately form a film with a target thickness on the first principal surface 2 of the glass substrate 5. Note that as the thickness meter 25, a quartz resonator monitor or the like can be used. Further, a thickness measurement of the actually deposited antifouling layer 7 can be calculated from, for example, a vibration period of an interference pattern of a reflected X-ray by an X-ray reflectivity method (XRR) when a thin film analysis X-ray diffractometer ATX-G (manufactured by RIGAKU Corporation) is used.

As stated above, the film-forming composition containing the fluorine-containing hydrolyzable silicon compound is adhered on the cohesive layer 6 of the glass substrate 5. Further, the fluorine-containing hydrolyzable silicon compound is chemically bonded to the cohesive layer 6 and siloxane bonding occurs between molecules by the hydrolysis and condensation reaction of the fluorine-containing hydrolyzable silicon compound which is occurred simultaneously with the adhesion or after the adhesion, and thereby, the fluorine-containing organosilicon compound film is formed.

The hydrolysis and condensation reaction of the fluorine-containing hydrolyzable silicon compound proceeds at the surface of the cohesive layer 6 simultaneously with the adhesion, but the glass substrate 5 where the fluorine-containing organosilicon compound film is formed may be heated by using a hot plate or a thermohydrostat after the glass substrate 5 is taken out of the vacuum chamber 33 according to need so as to further sufficiently accelerate this reaction. As conditions of the heat treatment, there can be cited, for example, the heat treatment of a temperature of 80° C. to 200° C. for 10 minutes to 60 minutes.

Note that the formation of the antifouling layer 7 may be performed under a state where the chamber 33 is humidified by connecting a humidifying apparatus or the like to the chamber 33. The heating treatment and humidifying process may be performed separately, or simultaneously. Besides, after the formation of the antifouling layer 7, for example, etching or the like may be performed by acid treatment or alkali treatment for the surface of the fluorine-containing organosilicon compound film to adjust the surface roughness (Ra) of the fluorine-containing organosilicon compound film to be, for example, 10 nm or less.

The adhesive 9 and the carrier substrate 10 adhered to the glass substrate 5 at the second principal surface 3 side are removed after the antifouling layer 7 is formed, and the glass substrate with the antifouling layer 1 is obtained. The glass substrate with the antifouling layer 1 of the embodiment obtained as stated above is excellent in the antifouling properties such as water repellency and oil repellency, and the antifouling layer has high abrasion resistance.

EXAMPLES

Next, examples of the present invention are described. The present invention is not limited to the following examples. Examples 1 to 5 are the examples of the present invention, and an example 6 and an example 7 are comparative examples.

A plate-shaped glass DT (Dragontrail (registered trademark) where strengthening treatment was not performed, manufactured by Asahi Glass Co., Ltd., aluminosilicate glass for chemical strengthening treatment) with a thickness of 1.3 mm, where a pair of principle surfaces facing to each other has each a square shape, was used as a glass substrate, and a glass substrate with an antifouling layer was each obtained according to the following procedure of each example. Hereinafter, one principle surface of the glass substrate is called as a first surface, the other principle surface of the glass substrate is called as a second surface, and a surface in a thickness direction of the glass substrate is called as a side surface.

Example 1

The glass substrate with the antifouling layer was obtained by performing (1) antiglare treatment, (2) chemical strengthening treatment, (3) alkali treatment, (4) formation of a black printed layer, (5) formation of a cohesive layer (low-reflection film), and (6) formation of an antifouling layer for the glass substrate in this order according to the following procedure.

(1) Antiglare Treatment (AG)

The antiglare treatment was performed for the first surface of the glass substrate by the frost treatment according to the following procedure.

At first, an acid-resistant protective film (hereinafter, it is referred to just as a "protective film") was bonded to a surface (second surface) of the glass substrate at a side where the antiglare treatment would not be performed. Next, this glass substrate was immersed into a 3 mass % hydrogen fluoride solution for 3 minutes, a surface of the first surface of the glass substrate was etched to thereby remove fouling adhered on the surface thereof. Next, the glass substrate was immersed into a mixed solution of 15 mass % hydrogen fluoride and 15 mass % potassium fluoride for 3 minutes, and the frost treatment was performed for the first surface of the glass substrate. This glass substrate was immersed into a 10 mass % hydrogen fluoride solution for 6 minutes, to thereby adjust the haze value of the first surface to be 25%. Note that the haze value was measured by using a haze meter (brand name: HZ-V3, manufactured by Suga Test Instruments Co., Ltd.) based on JIS K 7136.

The glass substrate where the antiglare treatment was performed as stated above was cut into a size of 150 mm×250 mm, and thereafter, the chemical strengthening treatment was performed.

(2) Chemical Strengthening Treatment

After the protective film adhered to the glass substrate was removed, the glass substrate was immersed into potassium nitrate salt which was heated to 450° C. to be melted for 2 hours. After that, the glass substrate was pulled up from the molten salt, and then gradually cooled to the room temperature for 1 hour to obtain the chemically strengthened glass substrate. The surface compressive stress (CS) of the chemically strengthened glass substrate obtained as stated above was 730 MPa, and the depth of the stress layer (DOL) was 30 μm.

(3) Alkali Treatment

Next, this glass substrate was immersed into an alkaline solution (manufactured by Lion Corporation, Sunwash TL-75) for 4 hours to remove fouling at a surface thereof.

(4) Formation of Black Printed Layer

Next, printing in a black frame state with a width of 2 cm by the screen printing was performed at all sides of a peripheral part of the surface (second surface) of the glass substrate where the antiglare treatment was not performed according to the following procedure, to form the black printed layer. At first, after a black ink (brand name: GLSHF, manufactured by Teikoku Printing Inks Mfg. Co., Ltd.) that was an organic ink containing pigment was coated with a thickness of 5 μm by a screen printer, the ink was held at 150° C. for 10 minutes to be dried, to form a first printed layer. Next, after the same black ink was coated with a thickness of 5 μm on the first printed layer according to the same procedure, the ink was held at 150° C. for 40 minutes to be dried, to form a second printed layer. The black printed layer where the first printed layer and the second printed layer were laminated was thereby formed, and the glass substrate having the black printed layer at an outside peripheral part of the second surface was obtained.

(5) Formation of Cohesive Layer (Low-Reflection Film (AR Film))

Next, the cohesive layer was formed on the side (first surface) where the antiglare treatment was performed and the side surface according to the following method.

At first, a polyimide double-sided adhesive tape (brand name: No. 6500, manufactured by Hitachi Maxell, Ltd.) with a width of 20 mm and a length of 400 mm was adhered as the adhesive on the black printed layer of the second surface of the glass substrate as same as one illustrated in FIG. 3, and the glass substrate was thereby adhered to a glass substrate (carrier substrate) which was larger than the glass substrate with a thickness of 2 mm, a width of 1000 mm, and a length of 1000 mm square. At this time, the double-sided adhesive tape was disposed to be exposed for 2 mm each in a longitudinal direction of the double-sided adhesive tape from an outer periphery of a pair of facing sides of the glass substrate. The carbon-containing component was thereby volatilized from this exposed part due to the heating or the plasma during the formation of the cohesive layer to be taken into the cohesive layer. In the example 1, an area of the exposed part of the adhesive was 5 area % relative to an area of the first surface of the glass substrate.

The cohesive layer was film-formed according to the following processes under a state where the glass substrate was adhered to the carrier substrate. At first, the pulse sputtering was performed under conditions of a pressure of 0.3 Pa, a frequency of 20 kHz, a power density of 3.8 W/cm$^2$, a reverse pulse width of 5 μsec by using a niobium oxide target (brand name: NBO target, manufactured by AGC Ceramics Co., Ltd.) while introducing mixed gas where 10 volume % of oxygen gas was mixed to argon gas into a chamber, to form a high refractive index layer (first layer) made of a niobium oxide (niobia) with a thickness of 13 nm.

Next, the pulse sputtering was performed under conditions of the pressure of 0.3 Pa, the frequency of 20 kHz, the power density of 3.8 W/cm$^2$, the reverse pulse width of 5 μsec by using a silicon target (manufactured by AGC Ceramics Co., Ltd.) while introducing mixed gas where 40 volume % of oxygen gas was mixed to argon gas into a chamber, to form a low refractive index layer (second layer) made of a silicon oxide (silica) with a thickness of 35 nm on the high refractive index layer.

Next, as same as the first layer, the high refractive index layer made of the niobium oxide (niobia) with a thickness of 115 nm was formed on the low refractive index layer that was the second layer. Next, as same as the second layer, the low refractive index layer made of the silicon oxide (silica) with the thickness of 80 nm was formed. As stated above, there was formed the cohesive layer (low-reflection film) where the niobium oxide (niobia) layer and the silicon oxide (silica) layer were laminated for a total of four layers. In the cohesive layer, the low refractive index layer that was a layer (contact layer) in contact with the antifouling layer became a carbon-containing silicon oxide layer.

(6) Formation of Antifouling Layer (AFP Layer)

Next, the antifouling layer was film-formed according to the following method. Note that the glass substrate was used while being adhered to the carrier substrate, and the antifouling layer was efficiently film-formed also on the side surface at the same time when the antifouling layer was film-formed on the surface (first surface) where the antiglare treatment was performed. When the antifouling layer was film-formed, an apparatus as same as the apparatus illustrated in FIG. 6 was used. At first, as a material of the antifouling layer, a formation material of the fluorine-containing organosilicon compound film was introduced into the heating container. After that, deaeration in the heating container was performed for 10 hours or more by a vacuum pump to remove solvent in the solution to make a formation composition of the fluorine-containing organosilicon compound film (hereafter, referred to as an antifouling layer forming composition). As the antifouling layer forming composition, KY-185 (manufactured by Shin-etsu Chemical Co., Ltd.) was used.

Next, the heating container accommodating the above-stated antifouling layer forming composition was heated to 270° C. After the temperature reached 270° C., the state was kept for 10 minutes until the temperature was stabilized. Next, after the glass substrate where the cohesive layer was formed was placed in the vacuum chamber, the antifouling layer forming composition was supplied from the manifold connected to the heating container accommodating the antifouling layer forming composition toward the cohesive layer (low-reflection film) of the glass substrate to perform the film-forming.

The film-forming was performed while measuring a thickness by the quartz resonator monitor placed in the vacuum chamber, and was continued until the thickness of the fluorine-containing organosilicon compound film on the cohesive layer became 4 nm. Next, the glass substrate taken out of the vacuum chamber was placed on the hot plate such that the fluorine-containing organosilicon compound film surface faced upward, and heat treatment was performed in the atmosphere at 150° C. for 60 minutes.

Example 2

The glass substrate where the processes of (1) antiglare treatment, (2) chemical strengthening treatment, (3) alkali treatment, (4) formation of the black printed layer were performed as same as the example 1 was laminated by a resin carrier substrate, and then (5) formation of the cohesive layer and (6) formation of the antifouling layer were performed under this state to obtain the glass substrate with the antifouling layer.

At first, the surface (second surface) of the glass substrate having the black printed layer was laminated by the resin carrier substrate where an acrylic-based adhesive was adhered as same as one illustrated in FIG. 4 before performing (5) formation of the cohesive layer. The adhesive was adhered to one principal surface of the resin carrier substrate wholly. Besides, it was laminated such that the adhesive exposes from the outer periphery of each side of the glass substrate for 10 mm each. As the resin carrier substrate, a polyethylene terephthalate (PET) film (brand name: RP-207, manufactured by Nitto Denko Corporation) was used. In the example 2, an area of the exposed part of the adhesive was 22.4 area % relative to the area of the first surface of the glass substrate.

The glass substrate where the resin carrier substrate was laminated was accommodated in the chamber, and (5) formation of the cohesive layer was performed as same as the example 1. Then (6) formation of the antifouling layer was performed by using the glass substrate where the cohesive layer was formed.

Example 3

The black printed layer of the glass substrate where the processes of (2) chemical strengthening treatment, (3) alkali treatment, (4) formation of the black printed layer were performed as same as the example 1 was held by an adsorption resin (an adhesive functioning also as the carrier substrate) which was larger than the second surface of the glass substrate. Under this state, in (5) formation of the cohesive layer in the example 3, only the low refractive index layer made of a carbon-containing silicon oxide (silica) with a thickness of 20 nm was formed according to the same procedure as the fourth layer in the example 1. Then (6) formation of the antifouling layer was performed by using the glass substrate where the cohesive layer was formed. According to the same procedure as the example 1, (6) formation of the antifouling layer was performed, and OPTOOL DSX (manufactured by DAIKIN Industries, Ltd.) was used as the antifouling layer forming composition instead of KY-185 (manufactured by Shin-etsu Chemical Co., Ltd.). An urethane rubber sheet (Ti-Prene TR-100-50, manufactured by Tigers Polymer Corporation) was used as the adsorption resin. At this time, the adsorption resin was set to be exposed from the outer periphery of each side of the glass substrate for 2 mm. In the example 3, an area of the exposed part of the adsorption resin was 4.3 area % relative to the area of the first surface of the glass substrate.

Example 4

The glass substrate with the antifouling layer was formed according to the same conditions and operations as the example 2 except that (4) formation of the black printed layer was not performed on the glass substrate and a silicone-based adsorption resin (IonPad, manufactured by Creative Technology Corporation) was used as the carrier substrate and the adhesive which hold the glass substrate. In the example 4, an area of the exposed part of the adsorption resin was 4.3 area % relative to the area of the first surface of the glass substrate.

Example 5

A resin carrier substrate where a polyurethane-based adhesive was adhered (PET film UA-3000AS, manufactured by Sumiron Co., Ltd.) was used to laminate instead of the resin carrier substrate where the acrylic-based adhesive was adhered in the example 2. At this time, the lamination was performed such that the adhesive exposes for 10 mm each from the outer periphery of each side of the glass substrate. The glass substrate with the antifouling layer was obtained by performing (5) formation of the cohesive layer and (6) formation of the antifouling layer for the laminated glass substrate. In (5) formation of the cohesive layer, the sputtering was performed according to the same procedure as the example 1 except that the constitution of the cohesive layer in the example 1 was changed as described below. According to the same procedure as the example 1, (6) formation of the antifouling layer was performed. In the example 5, an area of the exposed part of the adhesive was 34.5 area % relative to the area of the first surface of the glass substrate.

In the example 5, the cohesive layer was constituted by alternately laminating four layers of the high refractive index layers each made of the silicon nitride and four layers of the low refractive index layers each made of the silicon oxide according to the same method as the example 1. At this time, the carbon-containing component was volatilized from the exposed part of the adhesive due to the heating or the plasma during the formation of the cohesive layer to be taken the carbon-containing component into the cohesive layer. The high refractive index layer made of the silicon nitride was formed in the vacuum chamber by performing the pulse sputtering under conditions of a pressure of 0.3 Pa, a frequency of 20 kHz, a power density of 3.8 W/cm$^2$, a reverse pulse width of 5 μsec by using a silicon target while introducing mixed gas where 50 volume % of nitrogen gas was mixed to argon gas. Thicknesses of respective layers constituting the cohesive layer were that the first layer of the high refractive index layer (silicon nitride layer) was 15 nm, the second layer of the low refractive index layer (silicon oxide layer) was 70 nm, the third layer of the high refractive index layer (silicon nitride layer) was 17 nm, the fourth layer of the low refractive index layer (silicon oxide layer) was 105 nm, the fifth layer of the high refractive index layer (silicon nitride layer) was 15 nm, the sixth layer of the low refractive index layer (silicon oxide layer) was 50 nm, the seventh layer of the high refractive index layer (silicon nitride layer) was 120 nm, and the eighth layer of the low refractive index layer (carbon-containing silicon oxide layer) was 80 nm in this order from the glass substrate side.

Example 6

The glass substrate with the antifouling layer was obtained by performing (1) antiglare treatment, (2) chemical strengthening treatment, (3) alkali treatment, (4) formation of the black printed layer, (5) formation of the cohesive layer, (6) formation of the antifouling layer in this order according to the same procedure as the example 1 except that the glass substrate was held by the glass substrate that was the carrier substrate not by using the adhesive but by metal claws (metal material: stainless steel SUS304) in the example 1.

Example 7

The glass substrate with the antifouling layer was obtained by performing (1) antiglare treatment, (2) chemical strengthening treatment, (3) alkali treatment, (4) formation of the black printed layer, (5) formation of the cohesive layer, (6) formation of the antifouling layer in this order according to the same procedure as the example 1 except that the glass substrate was held by the glass substrate that was the carrier substrate not by using the adhesive but by the metal claws (metal material: stainless steel SUS304) in the example 1. Further, in (5) formation of the cohesive layer, the pressure was set to 1 Pa when SiO$_2$ of the layer which was in contact with the antifouling layer was film-formed.

There were performed a measurement of the water contact angle, measurements of the arithmetic mean roughness (Ra) and the carbon content of the layer of the cohesive layer which was in contact with the antifouling layer, an evaluation of an abrasion resistance, and a measurement of a luminous reflectance as described below regarding the glass substrates each with the antifouling layer obtained in the above-stated examples.

(Measurement of Water Contact Angle)

A water droplet of pure water of approximately 1 μL was dropped on the surface at the side (first surface) of the glass substrate with the antifouling layer where the antifouling layer was formed, and a contact angle relative to the water was measured by a contact angle meter (manufactured by Kyowa Interface Science Co., Ltd., device name: DM-501). Measurement positions of the water contact angle at the antifouling layer surface were set to be 10 points, and an average thereof was calculated to be used for evaluation. Results thereof are illustrated in Table 1.

(Measurement of Surface Roughness (Arithmetic Mean Roughness (Ra)) of Contact Layer)

A flat profile of the surface at the side where the antifouling layer of the glass substrate with the antifouling layer was formed was measured by the scanning probe microscope (model: SPA400, manufactured by Seiko Instruments Inc.). A measurement mode was set to a DFM mode, and an operation area was set to 3 μm×3 μm. A value of the Ra was found from the obtained flat profile based on JIS B 0601 (2001). Note that in the examples and the comparative examples, the thickness of the antifouling layer was extremely thin to be 4 nm, and therefore, a surface structure of each antifouling layer was formed by tracing a surface structure of the cohesive layer. Accordingly, the Ra of the antifouling layer was regarded as the Ra of the contact layer. Note that there was no change in the Ra after the removal process of the antifouling layer as described below was performed compared to the Ra according to the above-stated measurement. Besides, in case of the substrates where the antiglare treatment was each performed (the examples 1 to 2, the examples 4 to 7), a measurement region was selected such that the measurement is performed in a minute region so as not to include the concave-convex shape of the substrate in itself.

(Measurement of Concentration of Carbon Atoms of Contact Layer)

At first, an oxygen plasma treatment was performed to remove the antifouling layer formed on the glass substrate with the antifouling layer and organic contaminants on the surface, and thereafter, an ultraviolet ray (UV) ozone treatment was performed. Either one of these treatments may be performed depending on the thickness of the antifouling layer and a degree of the surface fouling.

In the oxygen plasma treatment, a low-temperature ashing apparatus (LTA-102 type, manufactured by Yanaco Analytical Industries Ltd.) was used. Treatment conditions were as follows: a high frequency output: 50 W, an oxygen flow rate: 50 ml/min, treatment time: 60 minutes.

In the UV ozone treatment, an ultraviolet irradiation apparatus PL30-200 (manufactured by Sen Engineering Co., Ltd.) was used, and UB2001D-20 was used as an ultraviolet irradiation apparatus power supply. Treatment conditions were as follows: ultraviolet-ray wavelength: 254 nm, treatment time: 10 minutes.

It was verified that there was no peak of fluorine by using an X-ray photoelectron spectroscopy regarding the glass substrate with the antifouling layer after the UV ozone treatment was finished, and thereby, it was verified that the antifouling layer at the surface was removed.

Next, a measurement of a carbon amount in the contact layer of the glass substrate with the antifouling layer was performed by a SIMS (secondary ion mass spectrometry) according to the following procedure.

(a) At first, a standard sample whose carbon atom concentration is already known is formed by ion implantation. A substrate or a single film having the same composition as a film that is an evaluation object is prepared in addition to the evaluation object sample. The prepared sample is preferable to have a low carbon atom concentration as much as possible. Here, a quartz glass substrate was prepared for a SiO$_2$ film evaluation.

In the ion implantation, $^{12}C$ ions are implanted to the quartz glass substrate at an energy of 110 keV by using IMX-3500RS (Ulvac Inc.). An implantation amount of $^{12}C$ ions is $1.5 \times 10^{15}$ ions/cm$^2$.

(b) Next, the evaluation object sample and the standard sample whose carbon atom concentration is already known formed in the above (a) are simultaneously conveyed into the SIMS apparatus, measurements are performed sequentially to obtain depth direction profiles of strengths of $^{12}C^-$ and $^{30}Si^-$. A relative sensitivity factor (RSF) is found from the depth direction profile of the standard sample, and a profile of the carbon atom concentration of a measurement sample is obtained by using the found RSF.

ADEPT1010 (manufactured by Ulvac-phi, Inc.) is used for the measurement of the SIMS. Primary ion irradiation is performed while setting measurement conditions of the SIMS as follows: $Cs^+$ as a primary ion species, acceleration voltage: 5 kV, current value: 150 nA, incident angle: 60° relative to a normal line of a sample surface, and raster size of primary ion: 600×600 μm². Regarding detection of secondary ions, a detection area is set to 120×120 μm² (4% of the raster size of the primary ion), field aperture of a detector is set to 2, and then the secondary ions each of whose polarity is minus are detected. At this time, a neutralization gun is used. Note that it is preferable that an inside of the apparatus is set to be high vacuum as much as possible in order to secure measurement accuracy. A degree of vacuum of the SIMS before the measurement start at this time was $6.7×10^{-8}$ Pa.

Besides, a sputtering (irradiation) rate of the primary ions for the $^{12}C$ ion implanted quartz glass substrate was 0.44 nm/sec. It is preferable to perform the measurement under a condition where the sputtering rate is high as much as possible in order to secure the measurement accuracy as same as the degree of vacuum in the apparatus.

Next, a horizontal axis of the profile of the carbon atom concentration of the measurement sample obtained in the above (b) is converted from a sputtering time into a depth as described below. A depth of a concave part (crater) of the evaluation object sample (glass substrate with the antifouling layer) after the analysis is measured by a stylus type surface profiler (manufactured by Veeco Instruments Inc. Dektak150), and the sputtering rate of the primary ions for the evaluation object sample is found. The horizontal axis is converted from the sputtering time into the depth by using the sputtering rates of the primary ions for each of the $^{12}C$ ion implanted quartz glass substrate and the evaluation object sample.

Next, the carbon atom concentration in the contact layer is calculated as described below from the profile of the carbon atom concentration of the measurement sample where the horizontal axis is converted into the depth. Adsorption carbon exists in a most vicinity of the surface of the contact layer, and this adsorption carbon is measured by the measurement according to the SIMS. Except the region where the adsorption carbon is measured, an average carbon atom concentration at a region that is a stagnation region where a secondary ion intensity of the contact layer is flat, and before the secondary ion intensity of Nb measured at a layer of the contact layer at the glass substrate side starts to increase, is set to a carbon concentration in the contact layer. As stated above, the average carbon atom concentrations were measured for three times as for each sample, and an average value thereof was set to the carbon (C) atom concentration. Results thereof are illustrated in Table 1.

(Evaluation of Abrasion Resistance)

At first, a plain weave cotton shirting No. 3 was attached to a surface of a flat metal indenter whose bottom surface is 10 mm×10 mm to be a friction block which rubs the sample. Next, the friction block was used, and an abrasion test was performed by a plane abrasion tester 3-barreled (manufactured by Daiei Kagaku Seiki MFG. Co., Ltd). Specifically, the indenter was attached to the abrasion tester such that the bottom surface of the indenter was in contact with the surface of the antifouling layer of the sample, a weight was set such that weighting on the friction block becomes 1000 g, and reciprocal sliding was performed at an average velocity of 6400 mm/min and one way of 40 mm. The test was performed by setting the number of rubbing times as two times per one reciprocation, and a water contact angle of the surface of the antifouling layer after the rubbing performed for 50000 times was measured as same as the above. Results thereof are illustrated in Table 1.

(Measurement of Luminous Reflectance)

A spectral reflectance was measured by a spectrophotometric colorimeter (model: CM-2600d, manufactured by Konica Minoruta, Inc.) in an SCI mode as for a region of an uppermost surface of the first surface of the glass substrate with the antifouling layer facing the black printed layer formed on the second surface, and a luminous reflectance (a stimulus value Y of reflection defined by JIS Z8701) was found from the spectral reflectance. Results thereof are illustrated in Table 1.

Contents and evaluation results of each process for the glass substrate with the antifouling layer in each of the examples 1 to 7 are illustrated in Table 1. In each column of the antiglare treatment and the chemical strengthening treatment in Table 1, "A" indicates that the process was performed, and "B" indicates that the process was not performed. Besides, in a column of the black printed layer, "A" indicates that the black printed layer was formed, and "B" indicates that the black printed layer was not formed.

TABLE 1

|  |  | Example 1 | Example 2 | Example 3 | Example 4 | Example 5 | Example 6 | Example 7 |
|---|---|---|---|---|---|---|---|---|
| Constitution | Antiglare Treatment | A | A | B | A | A | A | A |
|  | Chemical Strengthening Treatment | A | A | A | A | A | A | A |
|  | Black Printed Layer | A | A | A | B | A | A | A |
|  | Cohesive layer (In [Example], Low-Reflection Film [AR Film]) *Layer of Cohesive layer which is in contact with Antifouling Layer (Contact Layer) | $Nb_2O_5$ 13 nm $SiO_2$ 35 nm $Nb_2O_5$ 115 nm $SiO_2$ (*) 80 nm | $Nb_2O_5$ 13 nm $SiO_2$ 35 nm $Nb_2O_5$ 115 nm $SiO2$ (*) 80 nm | $SiO_2$ (*) 20 nm | $Nb_2O_5$ 13 nm $SiO_2$ 35 nm $Nb_2O_5$ 115 nm $SiO2$ (*) 80 nm | $Si_3N_4$ 15 nm $SiO_2$ 70 nm $Si_3N_4$ 17 nm $SiO_2$ 105 nm $Si_3N_4$ 15 nm $SiO_2$ 50 nm $Si_3N_4$ 120 nm | $Nb_2O_5$ 13 nm $SiO_2$ 35 nm $Nb_2O_5$ 115 nm $SiO_2$ (*) 80 nm | $Nb_2O_5$ 13 nm $SiO_2$ 35 nm $Nb_2O_5$ 115 nm $SiO_2$ (*) 80 nm (difference in film-forming pressure) |

TABLE 1-continued

|  |  |  | Example 1 | Example 2 | Example 3 | Example 4 | Example 5 | Example 6 | Example 7 |
|---|---|---|---|---|---|---|---|---|---|
|  | Antifouling Layer (AFP Layer) | Material | KY-185 | KY-185 | OPTOOL DSX | KY 185 | SiO$_2$(*) 80 nm KY-185 | KY-185 | KY-185 |
|  |  | Thickness | 4 nm | 4 nm | 4 nm | 4 nm | 4 nm | 4 nm | 4 nm |
|  | Holding Method of Glass Substrate | Carrier Substrate Adhesive | Glass Substrate Silicone-based Adhesive Polyimide Tape | PET Film Acrylic-based Adhesive | Urethane Rubber Adsorption Resin | Silicone-based Adsorption Resin | PET Film Poly-urethane-based Adhesive | Glass Substrate (Held by Metal Claws) | Glass Substrate (Held by Metal Claws) |
|  |  | Exposed Width of Adhesive (mm) | 2 | 10 | 2 | 2 | 10 | — | — |
|  |  | Area % of Adhesive | 5 | 22.4 | 4.3 | 4.3 | 34.5 | — | — |
| Evaluation | Uppermost Layer of Cohesive layer | Ra (nm) | 1.8 | 1.6 | 0.5 | 1.2 | 2.9 | 1.5 | 4.3 |
|  |  | C Atom Concentration ($\times 10^{18}$ atoms/cm$^3$) | 8.6 | 24.2 | 6.2 | 8.1 | 32.5 | 0.6 | 0.8 |
|  | RMS of Concave-Convex Shape of Antiglare Treatment |  | 150 | 135 | — | 155 | 140 | 143 | 150 |
|  | Water Contact Angle (°) |  | 112 | 113 | 116 | 114 | 110 | 113 | 113 |
|  | Water Contact Angle after 50000 times of rubbings (°) |  | 106 | 105 | 110 | 102 | 102 | 91 | 65 |
|  | Luminous Reflectance (Black Printed Part) (%) |  | 1.0 | 0.8 | 4.2 | 0.8 | 1.5 | 0.8 | 4.2 |

As illustrated in Table 1, in all of the glass substrates each with the antifouling layer of the examples 1 to 5, it was verified that the carbon atom concentration by SIMS at the contact layer was $8.1 \times 10^{18}$ atoms/cm$^3$ to $3.25 \times 10^{19}$ atoms/cm$^3$. In each of the glass substrates each with the antifouling layer of the examples 1 to 5, it can be seen that the water contact angle is large and the antifouling property is excellent. Besides, in each of the glass substrates with the antifouling layer of the examples 1 to 5, it can be seen that lowering of the water contact angle is small compared to an initial time even after the 50000 times of rubbings, and the antifouling layer has excellent abrasion resistance.

On the other hand, in each of the glass substrates with the antifouling layer of the examples 6 and 7, the carbon atom concentration by SIMS at the contact layer was $0.8 \times 10^{18}$ atoms/cm$^3$ or less, the water contact angle after the 50000 times of rubbings is lowered compared to an initial time, and it can be seen that the abrasion resistance of the antifouling layer deteriorates.

What is claimed is:

1. A glass substrate with an antifouling layer, comprising:
a glass plate which has a pair of principal surfaces facing to each other and an end face connecting the pair of principal surfaces;
a cohesive layer provided on one of the pair of principal surfaces of the glass plate and comprising a carbon-containing silicon oxide layer; and
an antifouling layer provided on a surface of the cohesive layer, wherein the antifouling layer is made of a cured product of a film-forming composition comprising a hydrolyzable silicon compound which comprises a fluorine atom,
the carbon-containing silicon oxide layer contacting the antifouling layer at a surface of the cohesive layer and comprising carbon atoms at a concentration ranging from $5 \times 10^{18}$ atoms/cm$^3$ to $5 \times 10^{19}$ atoms/cm$^3$ within a region having a depth from the surface of the cohesive layer of 80 nm or less,
wherein the glass substrate is a chemically strengthened glass.

2. The glass substrate with the antifouling layer according to claim 1,
wherein the surface of the cohesive layer in contact with the antifouling layer has an arithmetic mean roughness (Ra) of 3 nm or less.

3. The glass substrate with the antifouling layer according to claim 1,
wherein the cohesive layer comprises at least one layer and the number of layers included in the cohesive layer is in a range of from one to eight.

4. The glass substrate with the antifouling layer according to claim 1,
wherein the cohesive layer is a laminate in which a layer made of at least one compound selected from a silicon nitride, a niobium oxide, a tantalum oxide, and a zirconium oxide, and a layer made of the silicon oxide are stacked alternately.

5. The glass substrate with the antifouling layer according to claim 1,
wherein a root mean square roughness (RMS) of the one of the pair of principal surfaces is 10 nm or more.

6. The glass substrate with the antifouling layer according to claim 1, wherein a root mean square roughness (RMS) of the one of the pair of principal surfaces is 1000 nm or less.

7. The glass substrate with the antifouling layer according to claim 1,
wherein the cohesive layer and the antifouling layer extend along from the one of the pair of principal surfaces to the end face such that at least part of the end face is covered by the cohesive layer and the antifouling layer.

8. The glass substrate with the antifouling layer according to claim 1,
wherein the cohesive layer extends along from the one of the pair of principal surfaces to the end face, and the antifouling layer extends along from the surface of the cohesive layer to a surface of the end face, such that at least part of the end face is covered by the cohesive layer and the antifouling layer.

9. A front plate for a display comprising the glass substrate with the antifouling layer according to claim 1.

10. The glass substrate with the antifouling layer according to claim 1,
wherein the glass plate has at least one bending part.

11. The glass substrate with the antifouling layer according to claim 1,
wherein the glass plate is made of a chemical strengthened glass and has a surface compressive stress of from 450 to 1200 MPa.

12. The glass substrate with the antifouling layer according to claim 1,
wherein the antifouling layer has a thickness of from 2 to 20 nm.

13. The glass substrate with the antifouling layer according to claim 1,
wherein a water contact angle of a surface of the antifouling layer after a rubbing test is more than 102°, wherein the rubbing test is conducted by covering a surface of a metal indenter having a bottom surface of 10 mm×10 mm with a woven cotton, and by reciprocally sliding the indenter 50000 times under conditions of a weight of 1000 g, an average velocity of 6400 ram/min, and one way distance of 40 mm, while contacting the bottom surface of the indenter covered by the woven cotton with the surface of the antifouling layer.

* * * * *